United States Patent
Scott et al.

(10) Patent No.: US 9,742,359 B2
(45) Date of Patent: Aug. 22, 2017

(54) POWER AMPLIFIER WITH WIDE DYNAMIC RANGE AM FEEDBACK LINEARIZATION SCHEME

(71) Applicant: RF Micro Devices (Cayman Islands), Ltd., George Town, Grand Cayman (KY)

(72) Inventors: Baker Scott, San Jose, CA (US); George Maxim, Saratoga, CA (US)

(73) Assignee: Qorvo International PTE. Ltd., Singapore (SG)

( * ) Notice: Subject to any disclaimer, the term of this patent is extended or adjusted under 35 U.S.C. 154(b) by 0 days.

(21) Appl. No.: 14/217,199

(22) Filed: Mar. 17, 2014

(65) Prior Publication Data
US 2014/0266451 A1    Sep. 18, 2014

Related U.S. Application Data

(60) Provisional application No. 61/793,583, filed on Mar. 15, 2013, provisional application No. 61/789,508,
(Continued)

(51) Int. Cl.
*H03G 3/20*  (2006.01)
*H03F 1/32*  (2006.01)
(Continued)

(52) U.S. Cl.
CPC .......... *H03F 1/3241* (2013.01); *H01F 27/28* (2013.01); *H01F 27/385* (2013.01); *H03F 1/32* (2013.01);
(Continued)

(58) Field of Classification Search
CPC ....................................................... H03G 3/20
(Continued)

(56) References Cited

U.S. PATENT DOCUMENTS 5,339,017 A    8/1994  Yang
5,420,536 A    5/1995  Faulkner et al.
(Continued)

FOREIGN PATENT DOCUMENTS

EP      1184977 A2     3/2002
WO   2005117255 A1    12/2005

OTHER PUBLICATIONS

Bogya, Robert I., et al., "Linear Radio Frequency Power Amplifier Design Using Nonlinear Feedback Linearization Techniques," presented at the 60th Vehicular Technology Conference, vol. 3, Sep. 26-29, 2004, IEEE, pp. 2259-2263.
(Continued)

*Primary Examiner* — Henry Choe
(74) *Attorney, Agent, or Firm* — Withrow & Terranova, P.L.L.C.

(57) ABSTRACT

Circuitry, which includes a package interface, a radio frequency (RF) amplification circuit, and a closed-loop gain linearization circuit. The package interface receives an RF signal and provides an amplified RF signal. The RF amplification circuit amplifies the RF signal in accordance with a gain of the RF amplification circuit so as to generate the amplified RF signal. In one embodiment, the closed-loop gain linearization circuit is configured to endogenously establish a target gain magnitude using the RF signal and linearize the gain of the RF amplification circuit in accordance with the target gain magnitude. By endogenously establishing the target gain magnitude using the RF signal, the closed-loop gain linearization circuit can provide linearity with greater independence from external control circuitry.

16 Claims, 11 Drawing Sheets

Related U.S. Application Data filed on Mar. 15, 2013, provisional application No. 61/800,772, filed on Mar. 15, 2013, provisional application No. 61/800,991, filed on Mar. 15, 2013, provisional application No. 61/801,038, filed on Mar. 15, 2013, provisional application No. 61/946,270, filed on Feb. 28, 2014, provisional application No. 61/946,927, filed on Mar. 3, 2014.

(51) Int. Cl.

| | | |
|---|---|---|
| H03F 3/195 | (2006.01) | |
| H03F 3/21 | (2006.01) | |
| H03F 3/19 | (2006.01) | |
| H03F 3/213 | (2006.01) | |
| H01F 27/28 | (2006.01) | |
| H01F 27/38 | (2006.01) | |
| H03H 7/09 | (2006.01) | |
| H03H 7/01 | (2006.01) | |

(52) U.S. Cl.
CPC .............. *H03F 3/19* (2013.01); *H03F 3/195* (2013.01); *H03F 3/211* (2013.01); *H03F 3/213* (2013.01); *H03H 7/09* (2013.01); *H03H 7/1775* (2013.01)

(58) Field of Classification Search
USPC ........................................ 330/133, 278, 254
See application file for complete search history.

(56) References Cited

U.S. PATENT DOCUMENTS

| | | | |
|---|---|---|---|
| 5,507,014 A | 4/1996 | Wray et al. | |
| 5,675,288 A | 10/1997 | Peyrotte et al. | |
| 6,137,354 A | 10/2000 | Dacus et al. | |
| 6,330,289 B1 | 12/2001 | Keashly et al. | |
| 6,707,338 B2 | 3/2004 | Kenington et al. | |
| 6,819,938 B2 | 11/2004 | Sahota | |
| 6,836,517 B2 | 12/2004 | Nagatani et al. | |
| 6,980,774 B2 | 12/2005 | Shi | |
| 7,102,430 B2 | 9/2006 | Johnson et al. | |
| 7,164,313 B2 | 1/2007 | Capofreddi et al. | |
| 7,212,798 B1* | 5/2007 | Adams et al. ............. | 455/251.1 |
| 7,250,815 B2 | 7/2007 | Taylor et al. | |
| 7,317,353 B2 | 1/2008 | Hayase | |
| 7,321,264 B2 | 1/2008 | Kokkeler | |
| 7,333,557 B2 | 2/2008 | Rashev et al. | |
| 7,340,229 B2* | 3/2008 | Nakayama et al. ....... | 455/127.2 |
| 7,471,739 B1 | 12/2008 | Wright | |
| 7,652,532 B2 | 1/2010 | Li et al. | |
| 7,917,106 B2 | 3/2011 | Drogi et al. | |
| 7,970,360 B2 | 6/2011 | Pei | |
| 8,013,674 B2* | 9/2011 | Drogi et al. .................. | 330/136 |
| 8,126,409 B2 | 2/2012 | Osman et al. | |
| 8,175,551 B2 | 5/2012 | Akaiwa | |
| 8,344,806 B1 | 1/2013 | Franck et al. | |
| 8,346,179 B2 | 1/2013 | Brunn et al. | |
| 8,410,846 B2 | 4/2013 | Zare-Hoseini | |
| 8,620,233 B2 | 12/2013 | Brobston | |
| 8,624,678 B2 | 1/2014 | Scott et al. | |
| 8,653,888 B2 | 2/2014 | Watanabe | |
| 8,653,890 B1 | 2/2014 | Ahmed et al. | |
| 8,736,511 B2 | 5/2014 | Morris, III | |
| 8,749,310 B2 | 6/2014 | Hayes | |
| 8,791,769 B2 | 7/2014 | Leong et al. | |
| 8,829,995 B2* | 9/2014 | Cohen ........................... | 330/253 |
| 8,841,983 B2 | 9/2014 | Newton et al. | |
| 9,094,104 B2 | 7/2015 | Din et al. | |
| 9,124,355 B2 | 9/2015 | Black et al. | |
| 9,203,455 B2 | 12/2015 | Yang et al. | |
| 2002/0057139 A1 | 5/2002 | Matsumura et al. | |
| 2002/0186378 A1* | 12/2002 | Tazartes et al. ............. | 356/464 |
| 2002/0190795 A1 | 12/2002 | Hoang | |
| 2003/0008577 A1 | 1/2003 | Quigley et al. | |
| 2003/0151409 A1 | 8/2003 | Marek | |
| 2004/0121741 A1* | 6/2004 | Rashev et al. ............. | 455/114.3 |
| 2004/0162042 A1 | 8/2004 | Chen et al. | |
| 2004/0196085 A1 | 10/2004 | Shen | |
| 2004/0222868 A1 | 11/2004 | Rathgeber et al. | |
| 2005/0123064 A1 | 6/2005 | Ben-Ayun et al. | |
| 2005/0195063 A1 | 9/2005 | Mattsson | |
| 2005/0237144 A1 | 10/2005 | Einzinger et al. | |
| 2006/0033602 A1 | 2/2006 | Mattsson | |
| 2006/0125465 A1 | 6/2006 | Xiang et al. | |
| 2006/0226943 A1 | 10/2006 | Marques | |
| 2006/0261890 A1 | 11/2006 | Floyd et al. | |
| 2006/0281431 A1 | 12/2006 | Isaac et al. | |
| 2007/0161361 A1 | 7/2007 | Vaisanen et al. | |
| 2008/0096516 A1 | 4/2008 | Mun et al. | |
| 2008/0122560 A1 | 5/2008 | Liu | |
| 2009/0309661 A1 | 12/2009 | Chang et al. | |
| 2010/0013562 A1 | 1/2010 | Stockinger et al. | |
| 2011/0103494 A1 | 5/2011 | Ahmadi | |
| 2011/0163824 A1 | 7/2011 | Kawano | |
| 2011/0241163 A1 | 10/2011 | Liu et al. | |
| 2012/0081192 A1 | 4/2012 | Hanaoka | |
| 2012/0249266 A1 | 10/2012 | Lim et al. | |
| 2012/0262252 A1 | 10/2012 | Tseng et al. | |
| 2013/0049902 A1 | 2/2013 | Hendry et al. | |
| 2013/0244591 A1 | 9/2013 | Weissman et al. | |
| 2013/0295863 A1 | 11/2013 | Shanan | |
| 2014/0133189 A1 | 5/2014 | Worek | |
| 2014/0328220 A1 | 11/2014 | Khlat et al. | |
| 2015/0054582 A1* | 2/2015 | Goss ............................ | 330/279 |

OTHER PUBLICATIONS

Brounley, Richard W., "Matching Networks for Power Amplifiers Operating into High VSWR Loads," High Frequency Electronics, May 2004, pp. 58-62.

Charles, C.T. et al., "A Calibrated Phase and Amplitude Control System for a 1.9 GHz Phased-Array Transmitter Element," IEEE Transactions on Circuits and Systems 1: Regular Papers, vol. 56, No. 12, Dec. 2009, pp. 2728-2737.

Chen, Wei, et al., "A Novel VSWR-Protected and Controllable CMOS Class E Power Amplifier for Bluetooth Applications," International Journal of Design, Analysis and Tools for Circuits and Systems, vol. 1, No. 1, Jun. 2011, pp. 22-26.

D'Andrea, Aldo N., et al., "RF Power Amplifier Linearization through Amplitude and Phase Predistortion," IEEE Transactions on Communications, vol. 44, No. 11, Nov. 1996, pp. 1477-1484.

Dawson, J., et al., "Automatic Phase Alignment for a Fully Integrated Cartesian Feedback Power Amplifier System," IEEE Journal of Solid-State Circuits, vol. 38, No. 12, Dec. 2003, pp. 2269-2279.

Dawson, Joel L., "Feedback Linearization of RF Power Amplifiers," Dissertation for Stanford University, Stanford, Calif., Aug. 2003, 191 pages.

Delaunay, Nicolas, et al., "Linearization of a 65nm CMOS Power Amplifier with a Cartesian Feedback for W-CDMA Standard," Joint IEEE North-East Workshop on Circuits and Systems and TAISA Conference, Jun. 28-Jul. 1, 2009, Toulouse, France, 4 pages.

Do, Ji-Noon, et al., "W-CDMA High Power Amplifier Using Anti-Phase Intermodulation Distortion Linearization Technology," Asia-Pacific Microwave Conference, Dec. 11-14, 2007, Bangkok, Thailand, 4 pages.

Hoppenjans, Eric E., et al., "A Vertically Integrated Tunable UHF Filter," 2010 IEEE MTT-S International Microwave Symposium Digest (MTT), May 23-28, 2010, Anaheim, Calif., pp. 1380-1383.

Hu, Q.Z., et al., "A SiGe Power Amplifier with Power Detector and VSWR Protection for TD-SCDMA Application," Proceedings of the International Conference on Mixed Design of Integrated Circuits and Systems, Jun. 22-24, 2006, Gdynia, Poland, pp. 214-217.

Hur, J., et al., "An Amplitude and Phase Mismatches Calibration Technique for the LINC Transmitter with Unbalanced Phase Control," IEEE Transactions on Vehicular Technology, vol. 60, No. 9, Nov. 2011, pp. 4184-4193.

Idris, D., et al., "Design and Implementation of Self-Calibration for Digital Predistortion of Power Amplifiers," WSEAS Transactions on Circuits and Systems, vol. 7, No. 2, Feb. 2008, pp. 75-84.

(56) References Cited

OTHER PUBLICATIONS

Keerti, Arvind, et al., "RF Characterization of SiGe HBT Power Amplifiers under Load Mismatch," IEEE Transactions on Microwave Theory and Techniques, vol. 55, No. 2, Feb. 2007, pp. 207-214.

Kim, Jangheon et al., "Analysis of Adaptive Digital Feedback Linearization Techniques," IEEE Transactions on Circuits and Systems—1: Regular Papers, vol. 57, No. 2, Feb. 2010, pp. 345-354.

Ko, Sangwon, et al., "A Linearized Cascode CMOS Power Amplifier," IEEE Annual Wireless and Microwave Technology Conference, WAMICON '06, Dec. 4-6, 2006, Clearwater Beach, Florida, 4 pages.

Liu, Jenny Yi-Chun, et al., "Millimeter-Wave Self-Healing Power Amplifier with Adaptive Amplitude and Phase Linearization in 65-nm CMOS," IEEE Transactions on Microwave Theory and Techniques, vol. 60, No. 5, May 2012, pp. 1342-1352.

Mu, Xiaofang, et al., "Analysis of Output Power Variation under Mismatched Load in Power Amplifier FEM with Directional Coupler," IEEE MTT-S International Microwave Symposium Digest, Jun. 7-12, 2009, Boston, Mass., pp. 549-552.

Nakayama, Masatoshi, et al., "A Novel Amplitude and Phase Linearizing Technique for Microwave Power Amplifiers," IEEE MTT-S International Microwave Symposium Digest, vol. 3, May 16-20, 1995, Orlando, Fla., pp. 1451-1454.

Peng, Zhan, et al., "RF Power Amplifier Linearization Method Based on Quadrature Nonlinear Model," 1st International Conference on Information Science and Engineering, Dec. 26-28, 2009, Nanjing, China, pp. 2711-2713.

Rachakonda, Anil, et al., "Log Amps and Directional Couplers Enable VSWR Detection," RF Design Magazine, Jan. 2007, pp. 28-34.

Scuderi, Antonino, et al., "A VSWR-Rugged Silicon Bipolar RF Power Amplifier," Proceedings of the Bipolar/BiCMOS Circuits and Technology Meeting, Oct. 9-11, 2005, pp. 116-119.

So, Jinhyun, et al., "Digital Predistortion Based on Envelope Feedback," IEEE International Conference on Acoustics, Speech and Signal Processing (ICASSP), Mar. 25-30, 2012, Kyoto, Japan, pp. 3169-3172.

Woo, Wangmyong, et al., "A New Envelope Predistortion Linearization Architecture for Handset Power Amplifiers," IEEE Radio and Wireless Conference, Sep. 19-22, 2004, pp. 175-178.

Zhang, X. et al., "Gain/Phase Imbalance-Minimization Techniques for LINC Transmitters," IEEE Transactions on Microwave Theory and Techniques, vol. 49, No. 12, Dec. 2001, pp. 2507-2516.

International Search Report and Written Opinion for PCT/US2014/030431, dated Jun. 20, 2014, 14 pages.

Non-Final Office Action for U.S. Appl. No. 14/215,815, dated May 4, 2015, 13 pages.

Non-Final Office Action for U.S. Appl. No. 14/216,376, dated May 7, 2015, 8 pages.

Non-Final Office Action for U.S. Appl. No. 14/216,794, dated Jun. 30, 2015, 5 pages.

Non-Final Office Action for U.S. Appl. No. 14/216,560, dated Jul. 16, 2015, 9 pages.

Non-Final Office Action for U.S. Appl. No. 14/218,953, dated Jul. 24, 2015, 10 pages.

International Preliminary Report on Patentability for PCT/US/2014/030431, dated Sep. 24, 2015, 10 pages.

Notice of Allowance for U.S. Appl. No. 14/215,815, dated Oct. 1, 2015, 7 pages.

Non-Final Office Action for U.S. Appl. No. 14/215,800, dated Nov. 20, 2015, 5 pages.

Notice of Allowance for U.S. Appl. No. 14/216,794, dated Nov. 24, 2015, 7 pages.

Final Office Action for U.S. Appl. No. 14/218,953, dated Jan. 4, 2016, 11 pages.

Non-Final Office Action for U.S. Appl. No. 14/555,053, dated Dec. 31, 2015, 5 pages.

Notice of Allowance for U.S. Appl. No. 14/216,376, dated Feb. 22, 2016, 10 pages.

Final Office Action for U.S. Appl. No. 14/215,800, dated Mar. 11, 2016, 6 pages.

Non-Final Office Action for U.S. Appl. No. 14/216,560, dated Feb. 2, 2016, 9 pages.

Non-Final Office Action for U.S. Appl. No. 14/216,560, dated Aug. 16, 2016, 8 pages.

Final Office Action for U.S. Appl. No. 14/555,557, dated Sep. 20, 2016, 23 pages.

Notice of Allowance for U.S. Appl. No. 14/218,953, dated May 2, 2016, 5 pages.

Notice of Allowance for U.S. Appl. No. 14/555,053, dated Apr. 19, 2016, 7 pages.

Non-Final Office Action for U.S. Appl. No. 14/555,557, dated Jun. 13, 2016, 28 pages.

Non-Final Office Action for U.S. Appl. No. 14/215,800, dated Aug. 11, 2016, 6 pages.

Final Office Action for U.S. Appl. No. 14/215,800, dated Feb. 8, 2017, 7 pages.

Non-Final Office Action for U.S. Appl. No. 14/555,557, dated Feb. 13, 2017, 21 pages.

Advisory Action for U.S. Appl. No. 14/215,800, dated Apr. 20, 2017, 2 pages.

Notice of Allowance for U.S. Appl. No. 14/216,560, dated Apr. 20, 2017, 9 pages.

* cited by examiner

POWER AMPLIFIER WITH WIDE DYNAMIC RANGE AM FEEDBACK LINEARIZATION SCHEME

RELATED APPLICATIONS

The present application claims the benefit of and priority to U.S. Provisional Patent Application No. 61/793,583, filed Mar. 15, 2013; U.S. Provisional Patent Application No. 61/789,508, filed Mar. 15, 2013; U.S. Provisional Patent Application No. 61/800,772, filed Mar. 15, 2013; U.S. Provisional Patent Application No. 61/800,991, filed Mar. 15, 2013; U.S. Provisional Patent Application No. 61/801,038, filed Mar. 15, 2013; U.S. Provisional Patent Application No. 61/946,270, filed Feb. 28, 2014; and U.S. Provisional Patent Application No. 61/946,927, filed Mar. 3, 2014.

The present application is related to concurrently filed U.S. patent application Ser. No. 14/215,815, now U.S. Pat. No. 9,294,045 entitled "GAIN AND PHASE CALIBRATION FOR CLOSED LOOP FEEDBACK LINEARIZED AMPLIFIERS"; U.S. patent application Ser. No. 14/216,794, now U.S. Pat. No. 9,294,046, entitled "RF POWER AMPLIFIER WITH PM FEEDBACK LINEARIZATION"; U.S. patent application Ser. No. 14/215,800, entitled "WEAKLY COUPLED BASED HARMONIC REJECTION FILTER FOR FEEDBACK LINEARIZATION POWER AMPLIFIER"; U.S. patent application Ser. No. 14/218,953, now U.S. Pat. No. 9,444,411, entitled "RF POWER AMPLIFIER WITH TOTAL RADIATED POWER STABILIZATION"; U.S. patent application Ser. No. 14/216,376, now U.S. Pat. No. 9,391,565, entitled "AMPLIFIER PHASE DISTORTION CORRECTION BASED ON AMPLITUDE DISTORTION MEASUREMENT"; and U.S. patent application Ser. No. 14/216,560, entitled "RF REPLICATOR FOR ACCURATE MODULATED AMPLITUDE AND PHASE MEASUREMENT."

All of the applications listed above are hereby incorporated herein by reference in their entireties.

FIELD OF THE DISCLOSURE

The present disclosure relates generally to radio frequency (RF) amplification devices and methods of operating the same.

BACKGROUND

As wireless communications technologies evolve, wireless communications systems become increasingly sophisticated. As such, wireless communications protocols continue to expand and change to take advantage of the technological evolution. As a result, to maximize flexibility, many wireless communications devices must be capable of supporting any number of wireless communications protocols, each of which may have certain performance requirements, such as specific out-of-band emissions requirements, linearity requirements, or the like. Further, portable wireless communications devices are typically battery powered and need to be relatively small and inexpensive. As such, to minimize size, cost, and power consumption, radio frequency (RF) circuitry in such a wireless communications device needs to be as simple, small, and efficient as is practical. Thus, there is a need for RF circuitry in a wireless communications device that is low-cost, small, simple, efficient, and conforms to increasingly restrictive performance requirements.

SUMMARY

Circuitry, which includes a package interface, a radio frequency (RF) amplification circuit, and a closed-loop gain linearization circuit, is disclosed according to one embodiment of the present disclosure. The package interface receives an RF signal and provides an amplified RF signal. The RF amplification circuit amplifies the RF signal in accordance with a gain of the RF amplification circuit so as to generate the amplified RF signal. In one embodiment, the closed-loop gain linearization circuit is configured to endogenously establish a target gain magnitude using the RF signal and linearize the gain of the RF amplification circuit in accordance with the target gain magnitude. By endogenously establishing the target gain magnitude using the RF signal, the closed-loop gain linearization circuit can provide linearity with greater independence from external control circuitry.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
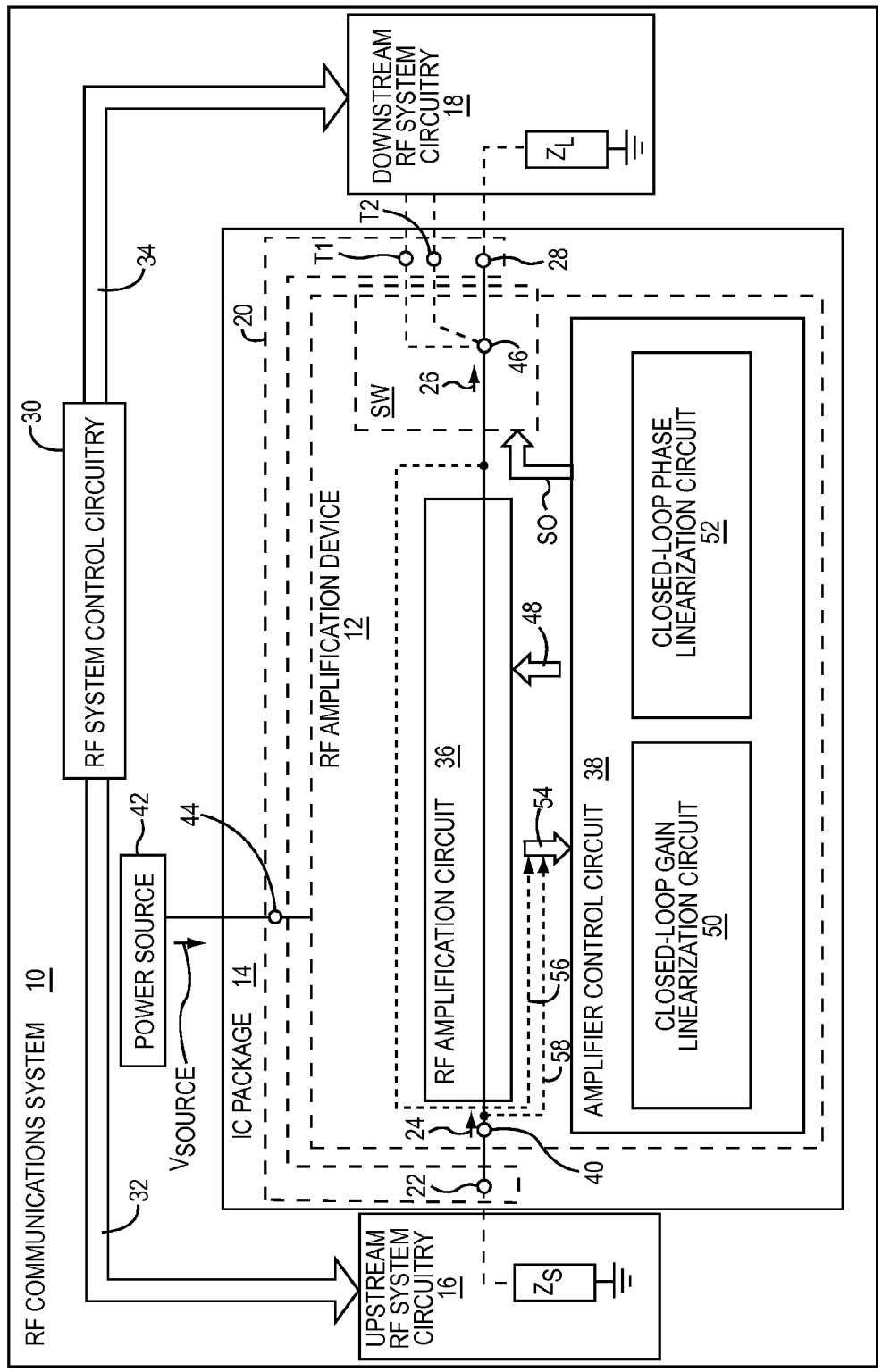
FIG. 1 illustrates a block diagram of an exemplary radio frequency (RF) communications system that includes an exemplary RF amplification device integrated into an exemplary integrated circuit (IC) package.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

With regard to the term "terminus," terminus refers to any conductive feature in an electronic component for receiving signals, transmitting signals, and/or establishing a connection to another electronic component. For instance, a terminus may be one or more nodes, ports, conductive pads, pins, solder bumps, terminals, leads, pins, and/or the like. To provide an example with regard to receiving and/or transmitting a single-ended signal, a terminus may be provided as a single terminal utilized to receive and/or transmit the single-ended signal. However, to be clear, this disclosure is not in any way limited to single-ended signals. Thus, to provide an example with regard to differential signals, a terminus may be provided as a pair of terminals for receiving and/or transmitting a positive and negative side of the differential signal.

With regard to the term "endogenous," endogenous refers to a signal, parameter, or action being derived and/or originating internally within an electronic component. For example, a set point for a closed-loop circuit is established endogenously by the closed-loop circuit, if the set point is derived and/or originates internally within the closed-loop circuit. In contrast, with regard to the term "exogenous," exogenous refers to a signal, parameter, or action being derived and/or originating externally from the electronic component. For example, the set point for a closed-loop circuit is established endogenously with respect to the closed-loop circuit, if the set point is derived and/or originates in external control circuitry outside of the closed-loop circuit.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

This disclosure relates to (radio frequency) RF communication systems for transmitting and/or receiving RF signals. In particular, this disclosure relates to RF amplification devices and methods for amplifying RF signals. As such, embodiments of exemplary RF amplification devices are described herein to comprehensively explain various innovative concepts and techniques related to the disclosure. In order to help describe these innovative concepts and techniques, the exemplary RF amplification devices disclosed herein include examples of exemplary circuits and circuit elements. To further elucidate these innovative concepts and techniques, the exemplary RF amplification devices are sometimes described as being employed within certain types of RF communication systems. It should be noted that the scope of this disclosure is not limited to the exemplary RF amplification device, circuits, circuit components, and RF communication systems specifically described herein. Rather, the scope of this disclosure extends to any and all systems, devices, circuits, circuit components and methods (whether described explicitly or implicitly) in accord with the innovative concepts and techniques described in this disclosure.

The innovative concepts and techniques described in this disclosure described herein can be used to amplify an RF signal with high power efficiency and/or by introducing low distortion. While not required, the exemplary RF amplification devices may thus be used to amplify RF signals provided within various RF communication bands and/or formatted in accordance with various RF communication standards in order to allow for wide-band amplification operations. However, the exemplary RF amplification devices described may implement to operate with increased autonomy and thus provide wide-band amplification operations with less or no support from other components within the RF communication system. The exemplary RF amplification devices can thus be easily provided within the RF communication system without requiring major customization and/or coordination with other system devices.

FIG. 1 illustrates a block diagram of one embodiment of an RF communications system 10. The RF communications system 10 may be any type of communication system capable of transmitting and/or receiving wireless communications signals. For example, the RF communications system 10 may be provided as an RF front-end module in a portable computing device (i.e., cellular phone, tablet, laptop) configured to transmit and/or receive information on one or more wireless communication networks. The RF communications system 10 may include one or more antennas and various transceiver chains (i.e., receiver chains and/or transmit chains) that process RF signals within different communication bands, formatted in accordance with different RF communication standards, and/or in accordance with different RF communication specifications for these RF communication standards.

In FIG. 1, the RF communications system 10 includes an exemplary RF amplification device 12 provided in an integrated circuit (IC) package 14. The RF amplification device 12 is coupled between upstream RF system circuitry 16 and downstream RF system circuitry 18 within the RF communications system 10. For example, the upstream RF system circuitry 16, the RF amplification device 12, and downstream RF system circuitry 18 may be or may be part of either one or more transmit chains or one or more receive chains within the RF communications system 10. The IC package 14 houses the RF amplification device 12 and allows the RF amplification device 12 to transmit and receive signals within the RF communications system 10 and external to the IC package 14. More specifically, the IC package 14 includes a package interface 20 configured to connect the RF amplification device 12 to external circuitry within the RF communications system 10. It should be noted that embodiments of the RF amplification device 12 may be provided as discrete component implementations.

As shown in FIG. 1, the package interface 20 includes a first package terminus 22 coupled to the upstream RF system circuitry 16. For example, the RF communications system 10 may be an RF transceiver and the upstream RF system circuitry 16, the RF amplification device 12, and downstream RF system circuitry 18 may be provided so as to form one or more transmit chains of the RF transceiver. As such, the RF communications system 10 may be provided in a user communication device, such as a laptop, a cellular phone, a tablet, a personal computer, or the like. In a transmit chain or in transmit chains, the upstream RF system circuitry 16 may include baseband circuitry and up-conversion circuitry that generates an RF signal 24. As such, the RF signal 24 is exogenous to the IC package 14 and thus the package interface 20 is coupled to the upstream RF system circuitry 16 in order to receive the RF signal 24 when the RF signal 24 is transmitted from the upstream RF system circuitry 16. More specifically, the IC package 14 receives the RF signal 24 at the first package terminus 22. The upstream RF system circuitry 16 thus provides a source of the RF amplification device 12 and presents a source impedance $Z_S$ at the first package terminus 22.

In the transmit chain(s), the RF amplification device 12 is configured to provide amplification prior to transmission by the RF communications system 10 from an antenna. As such, the RF amplification device 12 is configured to provide amplification to the RF signal 24 and generate an amplified RF signal 26. The amplified RF signal 26 is transmitted externally from a second package terminus 28 in the package interface 20 of the IC package 14 to the downstream RF system circuitry 18. A load of the RF amplification device 12 is thus provided by the downstream RF system circuitry 18, which presents a load impedance $Z_L$ at the second package terminus 28. Since this example presumes that the downstream RF system circuitry 18 is part of one or more transmit chains, the downstream RF system circuitry 18 includes the antenna of the RF communications system 10 along with an optional impedance tuner or antenna tuner. The downstream RF system circuitry 18 thus transmits the amplified RF signal 26 to the antenna, which emits the amplified RF signal 26.

The RF amplification device 12 shown in FIG. 1 is operable to operate autonomously and thus can be implemented in the RF communications system 10 without significant customization of the other components in the RF communications system 10. For example, the RF communications system 10 includes RF system control circuitry 30 which are external to the RF amplification device 12 and the IC package 14. The RF system control circuitry 30 is configured to provide control operations to coordinate the operations of the RF communications system 10. For example, the RF system control circuitry 30 may be configured to generate system control outputs 32, 34. A system control output 32 is received by the upstream RF system circuitry 16 in order to regulate its performance. Similarly, a system control output 34 is received by the downstream RF system circuitry 18 in order to regulate its performance. For example, the system control output 34 may tune the antenna tuner within the downstream RF system circuitry 18 and vary the load impedance $Z_L$. However, in this embodiment, the IC package 14, and thus the RF amplification device 12, does not receive a control output from the RF system control circuitry 30. Thus, the RF amplification device 12 can be implemented in the RF communications system 10 with little or no customization of the RF system control circuitry 30.

Alternatively, other embodiments of the IC package 14 and the RF amplification device 12 may receive control outputs from the RF system control circuitry 30 depending on the particular application being implemented. Nevertheless, the features of the RF amplification device 12 shown in FIG. 1 allow for the RF amplification device 12 to operate with more autonomy. Furthermore, the RF amplification device 12 may be designed to have wide-band amplification capabilities. Thus, the RF amplification device 12 is operable to amplify the RF signal 24 while allowing the RF signal 24 to be provided within different RF communication bands, to be formatted in accordance with different RF communication standards, and/or to be provided in accordance with different RF communication specifications within those RF communication standards. Exemplary RF communication standards and specifications include 2G Global System for Mobile Communications (GSM) standard (i.e., a Digital Communication System (DCS) specification, a Personal Communications Service (PCS) specification), GSM specifications, Enhanced Data Rates for GSM Evolution (EDGE) specifications of the 3G standard, Wireless Fidelity (Wi-Fi) Local Area Network (LAN) standards, and/or different specifications of the Long Term Evolution (LTE) standard. Furthermore, the RF signal 24 may be multiplexed in accordance with Time Division Duplex (TDD) techniques, Frequency Division Duplex (FDD) techniques, Space Division Multiplexing (SDM), Code Division Multiple Access Multiplexing (CDMA), Orthogonal Frequency Division Multiple Access Multiplexing (OFDMA), LTE diversity techniques, Multiple-Input and Multiple-Output (MIMO) techniques, and/or the like. The RF amplification device 12 is included in an RF signal path for the RF signal 24. The RF communications system 10 may or may not define additional RF signal paths for different communication bands, specifications, and/or communication standards.

The RF amplification device 12 shown in FIG. 1 includes an RF amplification circuit 36 and an amplifier control circuit 38. Thus, the RF amplification circuit 36 and the amplifier control circuit 38 are provided within the IC package 14. The RF amplification circuit 36 is configured to receive the RF signal 24 from the first package terminus 22 at an input terminus 40. A source voltage $V_{SOURCE}$ is generated by a power source 42 and provided to the RF amplification device 12 at a third package terminus 44 in the package interface 20. The source voltage $V_{SOURCE}$ powers the RF amplification circuit 36 and the amplifier control circuit 38 in the RF amplification device 12.

The RF amplification circuit 36 is configured to amplify the RF signal 24 so as to generate the amplified RF signal 26. In other words, the RF amplification circuit 36 provides amplification to the RF signal 24 by transferring power from the source voltage $V_{SOURCE}$ to the RF signal 24 thereby generating the amplified RF signal 26. The RF amplification circuit 36 then outputs the amplified RF signal 26 after amplification from an output terminus 46 coupled to the second package terminus 28. In this manner, the amplified RF signal 26 is transmitted externally to the downstream RF system circuitry 18.

The RF amplification circuit 36 may be configured to amplify the RF signal 24 when the RF signal 24 is provided in any one of plurality of communication bands and/or is formatted in accordance with any one of a multitude of RF communication standards. Often, the RF amplification circuit 36 is divided into RF amplification stages, including one or more driver RF amplification stages and a final RF amplification stage. Alternatively, the RF amplification circuit 36 may be provided having a single amplification stage. Other circuitry may be provided in the RF amplification circuit 36 in order to provide matching and/or to provide filtering so that undesired signal components (e.g., noise, harmonics) are reduced. The RF amplification circuit 36 is configured to amplify the RF signal 24 so as to generate the amplified RF signal 26 in accordance to a transfer function of the RF amplification circuit 36. Since the transfer function of the RF amplification circuit 36 is defined from input to output, the transfer function of the RF amplification circuit 36 shown in FIG. 1 is from the input terminus 40 to the output terminus 46.

Accordingly, as shown in FIG. 1, since the RF signal 24 may be provided within different RF communication bands, may be formatted in accordance with different RF communication standards, and/or may be provided in accordance with different RF communication specifications within those RF communication standards, the RF amplification device 12 may include an optional multiple-throw switch SW between the RF amplification circuit 36 and the downstream RF system circuitry 18. In this manner, the RF signal 24 may be exogenously transmitted to different antenna/impedance tuners (not shown) and antennas (not shown) in the downstream RF system circuitry 18, which may each be designed for particular or a particular combination RF communication bands, RF communication standards, and/or RF communication specifications. In this case, the output terminus 46 may be a pole port provided in the multiple-throw switch SW. The second package terminus 28 in the package interface 20 may be a throw port of the multiple-throw switch SW. However, the multiple-throw switch SW includes any number of additional throw ports, such as the additional package termini T1, T2 in the package interface 20. The multiple-throw switch SW may be configured to selectively connect the output terminus 46 to any of the package termini T1, T2, 28. In this manner, the multiple-throw switch SW can be used to route the amplified RF signal 26 to the appropriate antenna tuner and the appropriate antenna in the downstream RF system circuitry 18. In one embodiment, the amplifier control circuit 38 is configured to generate a switching output SO to control the multiple-throw switch SW. The multiple-throw switch SW is responsive to the switching output SO so as to selectively connect the output terminus 46 to one of the package termini T1, T2, 28.

With regard to the amplifier control circuit 38, the amplifier control circuit 38 is operably associated with the RF amplification circuit 36 and is configured to control the transfer function of the RF amplification circuit 36. To do this, the amplifier control circuit 38 is configured to generate a control output 48, which may include one or more control signals that may be utilized to control the transfer function of the RF amplification circuit 36. For example, the amplifier control circuit 38 may include biasing circuitry that generates one or more bias signals, RF power converters (i.e., Low-Drop Out Regulators, RF switching converters, charge pumps, the like, or any combination thereof) that generate one or more supply voltages from the source voltage $V_{SOURCE}$ to power the RF amplification circuit 36, phase shifting components, and/or control blocks that generate control signals to adjust characteristic values in the RF amplification circuit 36. As such, the control output 48 generated by the amplifier control circuit 38 may include one or more bias signals, one or more supply voltages, and/or one or more control signals from the control blocks.

As shown in FIG. 1, the amplifier control circuit 38 also includes a closed-loop gain linearization circuit 50 and a closed-loop phase linearization circuit 52. In alternative embodiments, the amplifier control circuit 38 may have or operate only one of the two closed-loop linearization circuits 50, 52. It may also include open-loop linearization circuits. Both the closed-loop gain linearization circuit 50 and the closed-loop phase linearization circuit 52 are configured to increase linearization of a response characteristic defined by the transfer function of the RF amplification circuit 36. More specifically, with regards to the closed-loop gain linearization circuit 50, the response characteristic is a gain defined by the transfer function of the RF amplification circuit 36. Accordingly, the closed-loop gain linearization circuit 50 is configured to increase linearity of the gain of the RF amplification circuit 36. With regards to the closed-loop phase linearization circuit 52, the response characteristic is a phase shift defined by the transfer function of the RF amplification circuit 36. Accordingly, the closed-loop phase linearization circuit 52 is configured to increase linearity of the phase shift of the RF amplification circuit 36. Thus, the closed-loop phase linearization circuit 52 is configured to keep the phase shift of the RF amplification circuit 36 approximately constant. The closed-loop gain linearization circuit 50 and the closed-loop phase linearization circuit 52 provide increase linearity of the gain and the phase shift, respectively, within a communication band of interest of the RF signal 24, which may be a processed modulation signal. In some embodiments, the closed-loop gain linearization circuit 50 and the closed-loop phase linearization circuit 52 substantially linearize the gain and the phase shift, respectively. However, in other embodiments, the closed-loop gain linearization circuit 50 and the closed-loop phase linearization circuit 52 may simply reduce non-linearity.

To regulate the transfer function of the RF amplification circuit 36, the closed-loop gain linearization circuit 50 and the closed-loop phase linearization circuit 52 are each configured to generate one or more control signals. These control signals may be part of the control output 48 provided by the amplifier control circuit 38 to the RF amplification circuit 36. Thus, the control signals generated by the closed-loop gain linearization circuit 50 and the closed-loop phase linearization circuit 52 may be used to directly regulate the transfer function of the RF amplification circuit 36. Additionally and/or alternatively, the control signals may be utilized as inputs to other circuitry within the amplifier control circuit 38. For example, the control signals may be used to regulate the biasing circuitry, the RF power converters, and/or may be utilized as inputs to the control blocks that generate control signals for adjusting the characteristic values in the RF amplification circuit 36. As such, the control signals generated by the closed-loop gain linearization circuit 50 and the closed-loop phase linearization circuit 52 may be used to indirectly regulate the transfer function of the RF amplification circuit 36.

The amplifier control circuit 38 is configured to receive a control input 54 from the RF amplification circuit 36. The control input 54 may include various control signals that indicate parameter values related to the performance of the RF amplification circuit 36. In this regard, the closed-loop gain linearization circuit 50 and the closed-loop phase linearization circuit 52 are closed loop because the control signals generated by the closed-loop gain linearization circuit 50 and the closed-loop phase linearization circuit 52 depend on an output (i.e., the amplified RF signal 26) of the RF amplification circuit 36 or an analog of the output. As such, the control input 54 includes at least one feedback signal 56 that depends on the amplified RF signal 26 or an analog of the amplified RF signal 26.

As mentioned above, the RF amplification device 12 can operate autonomously while still providing wide-band amplification operations. To do this, the closed-loop gain linearization circuit 50 and the closed-loop phase linearization circuit 52 each endogenously establish a set point of the amplified RF signal 26 using the RF signal 24. Accordingly, the RF amplification device 12 and the IC package 14 do not receive an external control signal from the RF communications system 10, such as a reference signal from the RF system control circuitry 30, in order to establish the set points of the closed-loop gain linearization circuit 50 and the closed-loop phase linearization circuit 52. Instead, the closed-loop gain linearization circuit 50 and the closed-loop phase linearization circuit 52 each are configured to establish their respective set points endogenously within the IC package 14. As such, the control input 54 includes at least one reference signal 58 that depends on the RF signal 24. The control input 54 may also include exogenous control signals (e.g., from other package termini) that are received by the closed-loop gain linearization circuit 50 and/or the closed-loop phase linearization circuit 52. For example, these exogenous control signals may indicate a communication band, an RF communication standard, an RF communication specification, and/or a signal frequency of the RF signal 24. These exogenous control signals may be used to change operational characteristics of the closed-loop gain linearization circuit 50 and/or the closed-loop phase linearization circuit 52, such as an operational bandwidth and/or harmonic filter frequencies of the closed-loop gain linearization circuit 50 and/or the closed-loop phase linearization circuit 52.

While the closed-loop gain linearization circuit 50 is activate, the transfer function of the RF amplification circuit 36 defines a closed-loop gain response, and while the closed-loop gain linearization circuit 50 is inactive, the transfer function of the RF amplification circuit 36 defines an open-loop gain response. The amplified RF signal 26 has a signal amplitude, which is related to a signal amplitude (i.e., signal envelope level) of the RF signal 24 by the gain of the RF amplification circuit 36. The set point endogenously established by the closed-loop gain linearization circuit 50 is a target reference amplitude of the signal amplitude of the amplified RF signal 26. The closed-loop gain linearization circuit 50 is configured to set the target reference amplitude according to a target gain magnitude of the gain of the RF amplification circuit 36. In other words, the target reference amplitude indicates what the signal amplitude of the amplified RF signal 26 should be in order to set a gain magnitude of the gain of the RF amplification circuit 36 to the target gain magnitude. As such, the set point of the closed-loop gain linearization circuit 50 is also the target gain magnitude.

Similarly, while the closed-loop phase linearization circuit 52 is activate, the transfer function of the RF amplification circuit 36 defines a closed-loop phase response and, while the closed-loop phase linearization circuit 52 is inactive, the transfer function of the RF amplification circuit 36 defines an open-loop phase response. The set point endogenously established by the closed-loop phase linearization circuit 52 is a target reference phase of the amplified RF signal 26. The amplified RF signal 26 has a signal phase, which is related to a signal phase of the RF signal 24 by a phase shift of the RF amplification circuit 36. The closed-loop gain linearization circuit 50 is configured to set the target reference phase based on the target phase magnitude of the phase shift provided by the RF amplification circuit 36. For example, if the target phase magnitude is approximately zero (0) degrees, then the target reference phase may be approximately equal to the signal phase of the RF signal 24. If the target phase magnitude is approximately one hundred eighty (180) degrees, then the target reference phase may be approximately equal to an inverse of the signal phase of the RF signal 24. By establishing the set points of the closed-loop gain linearization circuit 50 and the closed-loop phase linearization circuit 52 endogenously using the RF signal 24, the RF amplification device 12 can operate autonomously while increasing the linearity of the transfer function of the RF amplification circuit 36. In this manner, the RF amplification device 12 can provide high linearity amplification operations without requiring exogenous control signals from the RF communications system 10 that indicate the set points.

The embodiment of the amplifier control circuit 38 shown in FIG. 1 includes both the closed-loop gain linearization circuit 50 and the closed-loop phase linearization circuit 52. However, it should be noted that in alternative embodiments, the amplifier control circuit 38 may only include either the closed-loop gain linearization circuit 50 or the closed-loop phase linearization circuit 52. Whether both or either of the closed-loop gain linearization circuit 50 and the closed-loop phase linearization circuit 52 are provided may depend on the particular performance characteristics of the RF amplification circuit 36.

Figure 2:
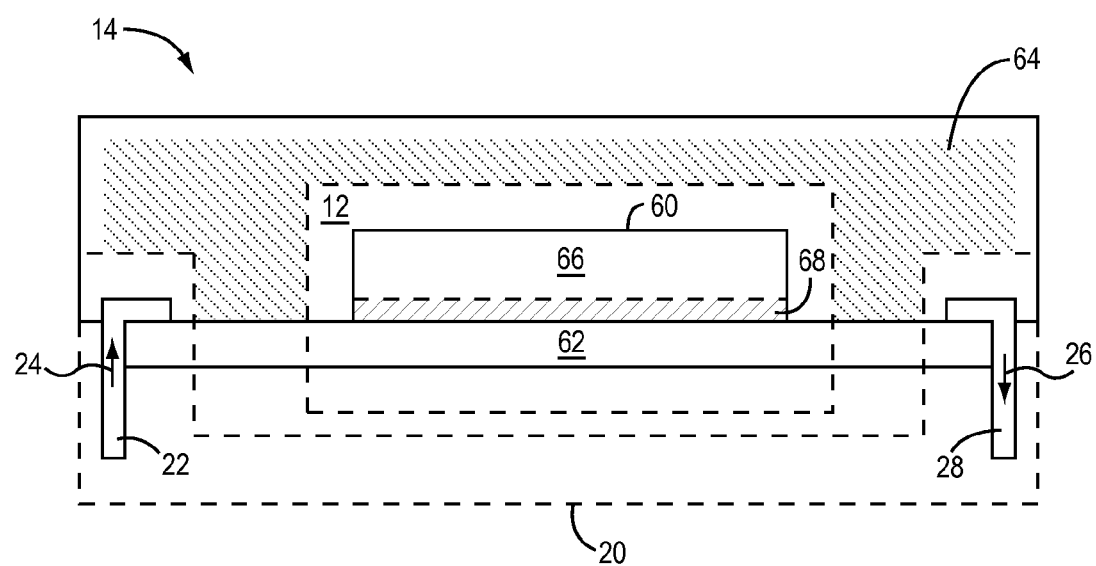
FIG. 2 is a cross-sectional view of an exemplary physical layout of the IC package shown in FIG. 1.

FIG. 2 is a cross-sectional view of an exemplary physical layout of the IC package 14 shown in FIG. 1. The RF amplification device 12 is integrated into the IC package 14 so that the IC package 14 houses the RF amplification device 12. The IC package 14 includes a semiconductor die 60, a package board 62, molding 64, and an exemplary embodiment of the package interface 20 described above in FIG. 1. An IC is formed by the semiconductor die 60. The RF amplification device 12 may be formed partially or entirely by the semiconductor die 60 depending on the application and topology of the RF amplification device 12. In alternative embodiments, the IC package 14 may include multiple semiconductor dice (like the semiconductor die 60) and the RF amplification device 12 may be built on the multiple semiconductor dies. For example, the RF amplification circuit 36 (shown in FIG. 1) and the amplifier control circuit 38 (shown in FIG. 1) may be formed on separate semiconductor dice. Additionally, one or more of the RF amplifier stages 36A, 36B, 36C (shown in FIG. 1) may be built on separate semiconductor dice. Furthermore, the closed-loop gain linearization circuit 50 and the closed-loop phase linearization circuit 52 may be built on separate semiconductor dice. Other types of substrates may be mounted in the IC package 14, such as glass substrates, plastic substrates, or any type of substrate made from a suitable substrate material. Portions of the RF amplification device 12 may be formed on these other types of substrates. These and other combinations would be apparent to one of ordinary skill in the art in light of this disclosure.

With regard to the semiconductor die 60 shown in FIG. 1, the semiconductor die 60 includes a semiconductor substrate 66 used to form active semiconductor components of the IC. The semiconductor substrate 66 may be formed from doped and non-doped layers of a suitable semiconductor material. For example, the semiconductor material may be Silicon (Si), Silicon Germanium (SiGe), Gallium Arsenide (GaAs), Indium Phosphorus (InP), and/or the like. Typical dopants that may be utilized to dope the semiconductor layers are Gallium (Ga), Arsenic (As), Silicon (Si), Tellurium (Te), Zinc (Zn), Sulfur (S), Boron (B), Phosphorus (P), Aluminum Gallium Arsenide (AlGaAs), Indium Gallium Arsenide (InGaAs), and/or the like. Furthermore, metallic layers may be formed on a top, within, and/or a bottom of the semiconductor substrate 66 to provide termini of the active semiconductor components, to form passive impedance elements, and/or the like. Insulating layers, such as oxide layers, and metal layers may also be provided in or on the semiconductor substrate 66. For example, the passive impedance elements may also be formed in or on the semiconductor substrate 66 from the metallic layers.

The semiconductor die 60 also includes a Back-End-of-Line (BEOL) 68, which may be formed from a non-conductive substrate and a plurality of metallic layers provided on or in the insulating substrate. The BEOL 68 is configured to couple the components on the semiconductor substrate 66 to one another. Termini may also be provided by the BEOL 68 to provide connections by external components to the IC. The BEOL 68 may also be used to form passive impedance elements.

A topology of the semiconductor die 60 formed by the semiconductor substrate 66 and the BEOL 68 that form the IC may be in accordance to any suitable semiconductor technology, such as Complementary Metal-On-Oxide Semiconductor technology (CMOS), Bipolar-Complementary Metal-On-Oxide Semiconductor technology (BiCMOS), Silicon-On-Insulator technology (SOI), and/or the like. In this embodiment, the topology of the semiconductor die 60 is provided in accordance with CMOS technology since it is inexpensive, allows the IC to be small, and allows for easy manufacturing. The closed-loop gain linearization circuit 50 (shown in FIG. 1) and the closed-loop phase linearization circuit 52 (shown in FIG. 1) allow for the topology of the semiconductor die 60 to be provided in accordance with CMOS technology while still providing high linearity amplification operations.

The semiconductor die 60 is mounted on the package board 62 within the IC package 14. The package board 62 may be formed by a plurality of board layers formed from a non-conductive material and metallic layers. The non-conductive material that forms the board layers may be a dielectric, a laminate, fibers, glass, ceramic, and/or the like. The dielectric may be a Silicon Oxide ($SiO_x$), Silicon Nitride ($SiN_x$), and/or the like. The laminate may be FR-1, FR-2, FR-3, FR-4, FR-5, FR-6, CEM-1, CEM-2, CEM-3, CEM-4, CEM-5, CX-5, CX-10, CX-20, CX-30, CX-40, CX-50, CX-60, CX-70, CX-80, CX-90, CX-100, and/or the like. The metallic layers of the package board may be used to form termini, passive impedance components, and connections. For instance, the metallic layers are used to form connections between the semiconductor die 60 and the package interface 20. Also, although the RF amplification device 12 may be provided entirely by the IC formed by the semiconductor die 60, components of the RF amplification device 12 may also be formed using the metallic layers in the package board 62. The semiconductor die 60 shown in FIG. 2 is encapsulated by the molding 64, which may be formed from a non-conductive material to help insulate the semiconductor die 60 and the RF amplification device 12. In this manner, the semiconductor die 60 is protected from external electromagnetic noise generated outside the IC package 14.

FIG. 2 also illustrates an example of the package interface 20. In this embodiment, the package interface 20 is coupled to the package board 62 so that signals can be transmitted to and received from circuitry external to the IC package 14. An embodiment of the first package terminus 22 for receiving the RF signal 24 and an embodiment of the second package terminus 28 for transmitting the amplified RF signal 26 are shown in FIG. 2. In this embodiment, the first package terminus 22 and the second package terminus 28 are each provided as pins connected to the package board 62. An embodiment of the third package terminus 44 (shown in FIG. 1 but not FIG. 2) is also provided as a pin connected to the package board 62. As mentioned above, the RF amplification device 12 may be configured to operate autonomously and thus the IC package 14 may have a small number of pins. For example, the IC package 14 may be less than eleven (11) pins. In this embodiment, the IC package 14 has a total of eight (8) pins.

Figure 3:
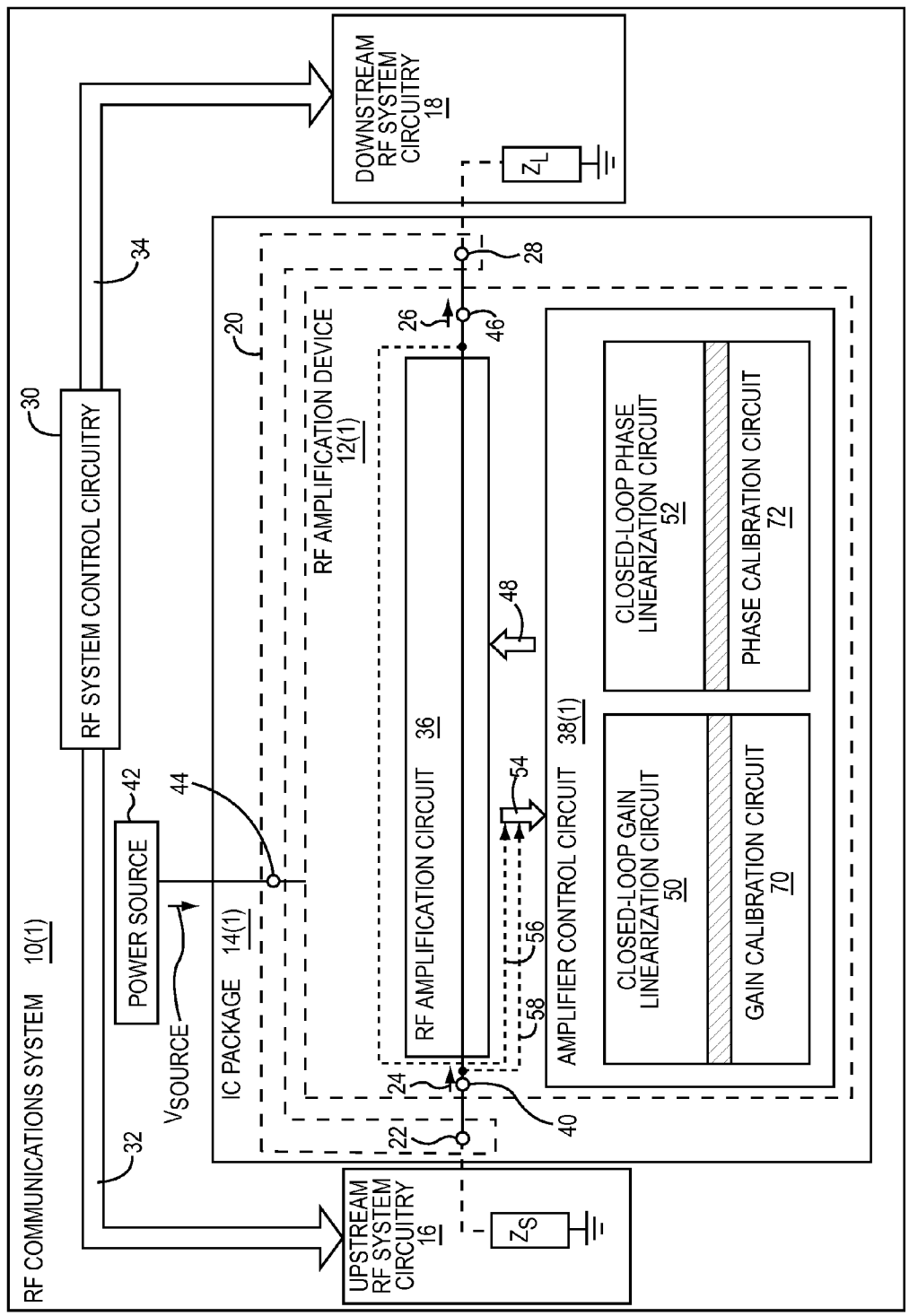
FIG. 3 is a block diagram of another exemplary RF communications system, RF amplification device, and IC package, which are embodiments of the RF communications system, the RF amplification device, and the IC package shown in FIG. 1.

Referring now to FIG. 3, FIG. 3 is a block diagram of another exemplary RF communications system 10(1), RF amplification device 12(1), and an IC package 14(1) that houses the RF amplification device, which are embodiments of the RF communications system 10, the RF amplification device 12, and the IC package 14 described above in FIG. 1. The RF amplification device 12 also includes the RF amplification circuit 36 described above with respect to FIG. 1 along with an amplifier control circuit 38(1). The amplifier control circuit 38(1) is one embodiment of the amplifier control circuit 38 described above with respect to FIG. 1. However, in this embodiment, the amplifier control circuit 38(1) further includes a gain calibration circuit 70 and a phase calibration circuit 72. Alternative embodiments of the amplifier control circuit 38(1) may include only the gain calibration circuit 70 or the phase calibration circuit 72.

Slanted lines are included between the gain calibration circuit 70 and the closed-loop gain linearization circuit 50 in order to indicate that the gain calibration circuit 70 and the closed-loop gain linearization circuit 50 may be partially integrated with one another (and thus share components) or may be independent (and thus not share components). As explained in further below, at small-signal power levels, the closed-loop gain linearization circuit 50 may be deactivated and thus the RF amplification circuit 36 may amplify the RF signal 24 in accordance with the open-loop gain response defined by the transfer function of the RF amplification circuit 36. At these small-signal power levels when the closed-loop gain linearization circuit 50 is inactive, the open-loop gain response may be substantially linear. As discussed above, while the closed-loop gain linearization circuit 50 is activate, the closed-loop gain response defined by the transfer function is also linear. However, without the gain calibration circuit 70, the gain of the RF amplification circuit 36 may be different during the closed-loop gain response and the open-loop gain response. The gain calibration circuit 70 is configured to reduce a difference between the closed-loop gain response and the open-loop gain response. For example, the gain calibration circuit 70 may be configured to substantially eliminate the difference between the closed-loop gain response and the open-loop gain response. Accordingly, the gain of the RF amplification circuit 36 may be substantially the same during the closed-loop gain response and the open-loop gain response.

With regard to the phase-calibration circuitry, slanted lines are included between the phase calibration circuit 72 and the closed-loop phase linearization circuit 52 in order to indicate that the phase calibration circuit 72 and the closed-loop phase linearization circuit 52 may be partially integrated with one another and thus share components) or may be independent (and thus not share components). As explained further below, at small-signal power levels, the closed-loop phase linearization circuit 52 may be inactive and thus the RF amplification circuit 36 may amplify the RF signal 24 in accordance with the open-loop phase response defined by the transfer function of the RF amplification circuit 36. At these small-signal power levels when the closed-loop phase linearization circuit 52 is inactive, the open-loop phase response may be substantially linear. As discussed above, while the closed-loop phase linearization circuit 52 is activate, the closed-loop phase response defined by the transfer function is also linear. However, without the phase calibration circuit 72, the phase shift of the RF amplification circuit 36 may be different during the closed-loop phase response and the open-loop phase response. The phase calibration circuit 72 is configured to reduce a difference of the closed-loop phase response and the open-loop phase response. For example, the phase calibration circuit 72 may be configured to substantially eliminate the difference between the closed-loop phase response and the open-loop phase response. Accordingly, the phase shift of the RF amplification circuit 36 may be substantially the same during the closed-loop phase response and the open-loop phase response.

Figure 4:
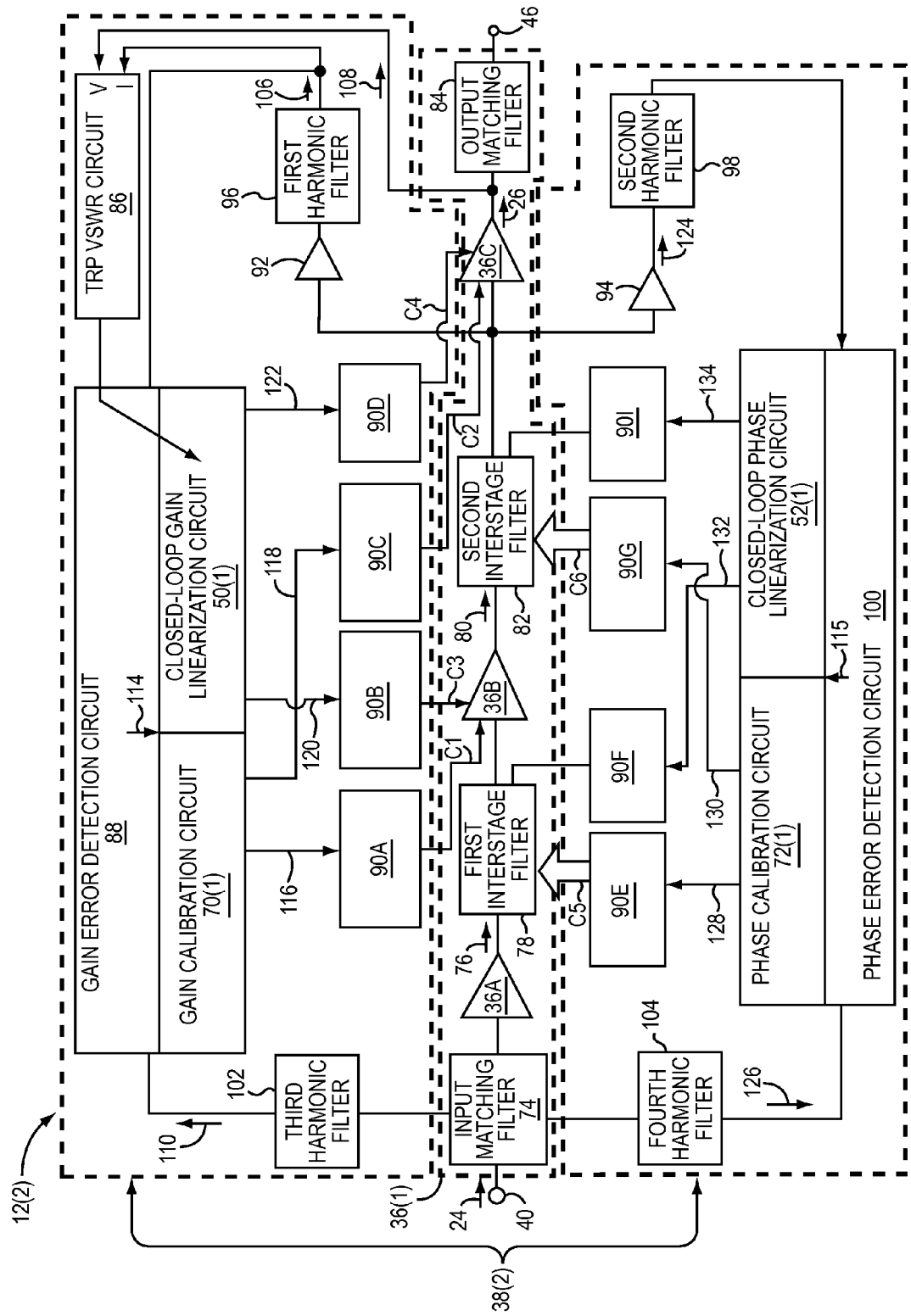
FIG. 4 is a block diagram of another embodiment of an RF amplification device, which is a more detailed example of the RF amplification device shown in FIG. 3.

FIG. 4 illustrates a block diagram of another embodiment of an RF amplification device 12(2), which is a more detailed example of the RF amplification device 12(1) shown in FIG. 3. The RF amplification device 12(2) includes one embodiment of an RF amplification circuit 36(1) and an embodiment of an amplifier control circuit 38(2). The RF amplification circuit 36(1) is one embodiment of the RF amplification circuit 36 described above in FIG. 1. However, in this embodiment, the RF amplification circuit 36(1) includes a plurality of RF amplifier stages 36A, 36B, 36C coupled in cascade. Accordingly, each of the plurality of RF amplifier stages 36A, 36B, 36C is operable to provide amplification and by being coupled in cascade, the RF amplifier stages 36A, 36B, 36C provide amplification to the RF signal 24 in sequence.

The RF amplification circuit 36(1) shown in FIG. 1 has an initial RF amplifier stage 36A, an intermediate RF amplifier stage 36B, and a final RF amplifier stage 36C. However, other embodiments of the RF amplification circuit 36(1) may include any number of RF amplifier stages as described above. Often, the initial RF amplifier stage 36A and the intermediate RF amplifier stage 36B are classified as "driver" RF amplifier stages. Since the final RF amplifier stage 36C handles the most power, some embodiments of the final RF amplifier stage 36C may include arrays of transistors or stacks of transistors in order to handle the power levels seen by the final RF amplifier stage 36C.

In this embodiment, an input matching filter 74 is configured to initially receive the RF signal 24 from the input terminus 40. The input matching filter 74 is configured to substantially match an input impedance of the RF amplification circuit 36(1) to the source impedance $Z_S$ (shown in FIG. 1) of the upstream RF system circuitry 16 (shown in FIG. 1). Since the RF amplifier stages 36A, 36B, 36C are coupled in cascade, the RF amplifier stages 36A, 36B, 36C provide amplification to the RF signal 24 in a sequence. Accordingly, the initial RF amplifier stage 36A receives the RF signal 24 from the input matching filter 74. The initial RF amplifier stage 36A is configured to amplify the RF signal 24 so as to generate a first interstage RF signal 76 in accordance with an amplifier gain $G_{initial}$. A first interstage filter 78 is coupled between the initial RF amplifier stage 36A and the intermediate RF amplifier stage 36B. The first interstage filter 78 is configured to filter undesired signal components (e.g., noise and/or harmonics) from the first interstage RF signal 76 after amplification by the initial RF amplifier stage 36A. Once the RF signal 24 is amplified by the initial RF amplifier stage 36A and the first interstage RF signal 76 has been filtered by the first interstage filter 78, the intermediate RF amplifier stage 36B receives the first interstage RF signal 76.

The intermediate RF amplifier stage 36B is configured to amplify the first interstage RF signal 76 so as to generate a second interstage RF signal 80 in accordance with an amplifier gain $G_{intermediate}$. A second interstage filter 82 is coupled between the intermediate RF amplifier stage 36B and the final RF amplifier stage 36C. The second interstage filter 82 is configured to filter undesired harmonics from the second interstage RF signal 80 after amplification by the intermediate RF amplifier stage 36B. Once the first interstage RF signal 76 is amplified by the intermediate RF amplifier stage 36B and the second interstage RF signal 80 has been filtered by the second interstage filter 82, the final RF amplifier stage 36C receives the second interstage filter 82. The final RF amplifier stage 36C is configured to amplify the RF signal 24 so as to generate the amplified RF signal 26 in accordance to an amplifier gain $G_{final}$. As such, the gain of the RF amplification circuit 36(1) may be described as $G_{initial}*G_{intermediate}*G_{final}$. An output matching filter 84 is coupled to the final RF amplifier stage 36C so as to receive the amplified RF signal 26. The output matching filter 84 is configured to substantially match an output impedance of the RF amplification circuit 36(1) to the load impedance $Z_L$ (shown in FIG. 1) of the downstream RF system circuitry 18 (shown in FIG. 1).

The amplifier gain $G_{initial}$, the amplifier gain $G_{intermediate}$, and the amplifier gain $G_{final}$ may each be any type of amplifier gain (e.g., a voltage gain, a transconductance gain, a transresistance gain, a current gain) depending on the topology of each of the corresponding RF amplifier stages 36A, 36B, 36C. For example, the amplifier gain $G_{initial}$, the amplifier gain $G_{intermediate}$, and the amplifier gain $G_{final}$ may each be the same type of amplifier gain or each may be a different types of amplifier gain. As such, the gain of the RF amplification circuit 36(1) may be any type of amplifier gain depending on a combination of the types amplifier gain $G_{initial}$, the amplifier gain $G_{intermediate}$, and the amplifier gain $G_{final}$ provided by each of the RF amplifier stages 36A, 36B, 36C.

Note that as amplification progresses through the sequence of the RF amplifier stages 36A, 36B, 36C, each of the RF amplifier stages 36A, 36B, 36C, handles an increasing amount of power. Therefore, the initial RF amplifier stage 36A handles the least amount of power, since it receives the RF signal 24 prior to amplification and transmits the first interstage RF signal 76 amplified only in accordance with the amplifier gain $G_{initial}$. In one embodiment, the amplifier gain $G_{initial}$ is a voltage gain. Thus, the initial RF amplifier stage 36A amplifies the RF signal 24 such that the amplifier gain $G_{initial}$ approximately describes a proportion between a voltage level of the first interstage RF signal 76 and a voltage level of the RF signal 24.

When the intermediate RF amplifier stage 36B receives the first interstage RF signal 76, the first interstage RF signal 76 has already been amplified by the amplifier gain $G_{initial}$. The intermediate RF amplifier stage 36B further amplifies the first interstage RF signal 76 and generates the second interstage RF signal 80. Thus, the intermediate RF amplifier stage 36B transmits the second interstage RF signal 80 amplified in accordance with the amplifier gain $G_{initial}*G_{intermediate}$. As a result, the intermediate RF amplifier stage 36B handles an intermediate amount of power. In one embodiment, the amplifier gain $G_{intermediate}$ is a transconductance gain. Thus, the intermediate RF amplifier stage 36B amplifies the first interstage RF signal 76 such that the amplifier gain $G_{intermediate}$ approximately describes a proportion between a current level of the second interstage RF signal 80 and the voltage level of the first interstage RF signal 76.

With regard to the final RF amplifier stage 36C, the final RF amplifier stage 36C receives the second interstage RF signal 80 amplified in accordance with the aggregate amplifier gain $G_{initial}*G_{intermediate}$. As such, when the final RF amplifier stage 36C further amplifies the second interstage RF signal 80 so as to generate the amplified RF signal 26. In one embodiment, the amplifier gain $G_{final}$ is a current gain. Thus, the final RF amplifier stage 36C amplifies the second interstage RF signal 80 such that the amplifier gain $G_{final}$ approximately describes a proportion between a current level of the amplified RF signal 26 and the current level of the second interstage RF signal 80. The final RF amplifier stage 36C thus transmits the amplified RF signal 26 amplified in accordance with the (total) gain $(G_{initial}*G_{intermediate}*G_{final})$ of the RF amplification circuit 36(1). As such, the final RF amplifier stage 36C handles the most power. Furthermore the (total) gain of the RF amplification circuit 36(1) is a transconductance gain.

Alternatively, the amplifier gain $G_{final}$ of the final RF amplifier stage 36C may be a transconductance gain. In this alternative embodiment, the output matching filter 84 may be configured to present an input impedance that converts a current level of the amplified RF signal 26 provided by the final RF amplifier stage 36C into a voltage level. Additionally, in another alternative embodiment, the amplifier gain $G_{intermediate}$ of the intermediate RF amplifier stage 36B is a transconductance gain, and a load impedance of the second interstage filter 82 converts a current level of the second interstage RF signal 80 into a voltage level.

FIG. 4 also illustrates the amplifier control circuit 38(2) used to regulate the RF amplification circuit 36(1). The amplifier control circuit 38(2) includes a closed-loop gain linearization circuit 50(1), a phase calibration circuit 72(1), a gain calibration circuit 70(1), and a phase calibration circuit 72(1), which are embodiments of the closed-loop gain linearization circuit 50, the phase calibration circuit 72, the gain calibration circuit 70, and the phase calibration circuit 72 described above with respect to FIGS. 1 and 3. The amplifier control circuit 38(2) further includes a Total Radiated Power (TRP) Voltage Standing Wave Ratio (VSWR) circuit 86, a gain error detection circuit 88, a driver stage gain control block 90A, a driver stage gain control block 90B, a final stage gain control block 90C, a final stage gain control block 90D, a driver stage phase control block 90E, a driver stage phase control block 90F, a final stage phase control block 90G, a final stage phase control block 90I, a first final stage replica amplifier 92, a second final stage replica amplifier 94, a first harmonic filter 96, a second harmonic filter 98, a phase error detection circuit 100, a third harmonic filter 102, and a fourth harmonic filter 104.

The TRP VSWR circuit 86 is a closed-loop feedback control circuit configured to make a VSWR measurement and adjust a feedback gain of the closed-loop gain linearization circuit 50 in accordance with the VSWR measurement. For example, the TRP VSWR circuit 86 may be configured to adjust the feedback gain of the closed-loop gain linearization circuit 50 in accordance with the VSWR measurement so as to maintain an output power level of the amplified RF signal 26 substantially constant over a range of the load impedance $Z_L$ (shown in FIG. 1). The TRP VSWR circuit 86 may be configured to adjust the feedback gain of the closed-loop gain linearization circuit 50 in accordance with the VSWR measurement so as to maintain the closed-loop gain linearization circuit 50 out of unstable control regions. In order to make the VSWR measurement, the TRP VSWR circuit 86 is configured to receive a first feedback signal 106 and a second feedback signal 108. The first feedback signal 106 has a first feedback signal level that is indicative of a current level of the amplified RF signal 26. The second feedback signal 108 has a second feedback signal level that is indicative of a voltage level of the amplified RF signal 26. As such, the TRP VSWR circuit 86 is configured to make the VSWR measurement using the first feedback signal 106 and the second feedback signal 108. In combination, the first feedback signal level of the first feedback signal 106 and the second feedback signal level of the second feedback signal 108 are indicative of TRP of the amplified RF signal 26.

In this embodiment, the closed-loop gain linearization circuit 50 and the gain calibration circuit 70 are partially amalgamated since the closed-loop gain linearization circuit 50 and the gain calibration circuit 70 share the gain error detection circuit 88. Alternatively, the closed-loop gain linearization circuit 50 and the gain calibration circuit 70 may each have independent error detection circuits (like the gain error detection circuit 88) and may thus be independent of one another. In this embodiment, the gain error detection circuit 88 is configured to receive the first feedback signal 106 and a first reference signal 110 having a reference signal level that is indicative of a power level of the RF signal 24. Using the first reference signal 110, the gain error detection circuit 88 is configured to set the set point of the closed-loop gain linearization circuit, which is indicative of the target reference amplitude of the amplified RF signal 26. The set point therefore further indicates the target gain magnitude, and is established based on the reference signal level of the first reference signal 110. By having the TRP VSWR circuit 86 adjust the feedback gain based on the VSWR measurement and using the first feedback signal 106, the gain error detection circuit 88 is configured to provide feedback indicative of a signal power level of the amplified RF signal 26. The gain error detection circuit 88 is configured to compare the feedback and the set point to generate a gain error signal 114 having an error signal level indicative of a power level error between the feedback and the set point. For example, the reference signal level may indicate a current level of the amplified RF signal 26. Given an impedance value of the load impedance $Z_L$ (shown in FIG. 1), the current level indicates the signal power level. If the impedance value changes to a different impedance value, the TRP VSWR circuit 86 adjusts the feedback gain so that the current level of the amplified RF signal 26 continues to indicate the signal power level of the amplified RF signal 26. As such, the reference signal level also indicates the signal power level.

The gain error signal 114 is provided to the closed-loop gain linearization circuit 50(1) and the gain calibration circuit 70(1). With regard to the gain calibration circuit 70(1), the gain calibration circuit 70(1) is configured to use the gain error signal 114 to determine calibration points as explained in further detail below. In this embodiment, the gain calibration circuit 70(1) is operably associated with the driver stage gain control block 90A and the final stage gain control block 90C. As shown in the following description, two or more gain control blocks 90A, 90C can be provided to operate with more than one of the RF amplifier stages 36A, 36B, 36C. In this embodiment, the gain calibration circuit 70(1) is configured to generate a first gain calibration signal 116 which is received by the driver stage gain control block 90A and a second gain calibration signal 118 which is received by the final stage gain control block 90C. The driver stage gain control block 90A is configured to generate a control signal C1 that sets the gain of the intermediate RF amplifier stage 36B while the final stage gain control block 90C is configured to generate a control signal C2 that sets the gain of the final RF amplifier stage 36C. With the first gain calibration signal 116 and the second gain calibration signal 118, the gain calibration circuit 70(1) is configured to control the driver stage gain control block 90A and the final stage gain control block 90C and thereby control the gain of the RF amplification circuit 36(1). As explained in further detail below, the gain calibration circuit 70(1) controls the gain of the RF amplification circuit 36(1) in order to reduce the difference between the open-loop gain response and closed-loop gain response of the RF amplification circuit 36(1). In one exemplary embodiment, the driver stage gain control block 90A is an impedance control and the control signal C1 is an impedance control signal that sets an internal impedance level of the intermediate RF amplifier stage 36B. Additionally, the final stage gain control block 90C is a final stage biasing circuit and the control signal C2 is a bias signal that sets a quiescent operating level of the final RF amplifier stage 36C. In alternative embodiments, the gain control blocks 90A, 90C may be configured to control other operational characteristics such as biasing, impedance, and the like.

With regard to the closed-loop gain linearization circuit 50(1), the closed-loop gain linearization circuit 50(1) is configured to adjust the gain of the RF amplification circuit 36(1) in accordance to the gain error signal 114 while activated so as to maintain the gain of the RF amplification circuit 36(1) relatively constant. In this embodiment, the closed-loop gain linearization circuit 50(1) is operably associated with the driver stage gain control block 90B and the final stage gain control block 90D. The closed-loop gain linearization circuit 50(1) is configured to generate a first gain control signal 120 which is received by the driver stage gain control block 90B and a second gain control signal 122 which is received by the final stage gain control block 90D. The driver stage gain control block 90B is configured to generate a control signal C3 that sets the gain of the intermediate RF amplifier stage 36B while the final stage gain control block 90D 90CF is configured to generate a control signal C4 that sets the gain of the final RF amplifier stage 36C. With the first gain control signal 120 and the second gain control signal 122, the closed-loop gain linearization circuit 50(1) is configured to control the driver stage gain control block 90B and the final stage gain control block 90D and thereby control the gain of the RF amplification circuit 36(1). As explained in further detail below, the closed-loop gain linearization circuit 50(1) regulates the gain of the RF amplification circuit 36(1) in order to maintain the closed-loop gain response of the RF amplification circuit 36(1) substantially constant. In one exemplary embodiment, the driver stage gain control block 90B is an impedance control block with a low pass filter and the control signal C3 is an impedance control signal that sets an internal impedance level of the intermediate RF amplifier stage 36B. Additionally, the final stage gain control block 90D is a biasing circuit with a low pass filter and the control signal C4 is a bias signal that sets the quiescent operating level of the final RF amplifier stage 36C.

With regard to phase control, the closed-loop phase linearization circuit 52(1) and the phase calibration circuit 72(1) are partially amalgamated since the closed-loop phase linearization circuit 52(1) and the phase calibration circuit 72(1) share a phase error detection circuit 100. Alternatively, the closed-loop phase linearization circuit 52(1) and the phase calibration circuit 72(1) may each have independent error detection circuits (like the phase error detection circuit 100) and may thus be independent of one another. In this embodiment, the phase error detection circuit 100 is configured to receive a third feedback signal 124 having a third feedback signal level that indicates a phase of the amplified RF signal 26 and a second reference signal 126 having a second reference signal level that is indicative of a phase of the RF signal 24. Using the second reference signal 126, the phase error detection circuit 100 is configured to set the set point of the closed-loop phase linearization circuit 52(1), which is indicative of a target phase shift of the RF amplification circuit 36(1). The phase error detection circuit 100 is also configured to compare measure the phase shift of the RF amplification circuit 36(1) using the third feedback signal 124 and the second reference signal 126 as feedback. The phase error detection circuit 100 generates a phase error signal 115 having an error signal level indicative of a phase shift error between the feedback and the set point (reference).

The phase error signal 115 is provided to the closed-loop phase linearization circuit 52(1) and the phase calibration circuit 72(1). With regard to the phase calibration circuit 72(1), the phase calibration circuit 72(1) is configured to use the phase error signal 115 to determine calibration points as explained in further detail below. In this embodiment, the phase calibration circuit 72(1) is operably associated with the driver stage phase control block 90E and the final stage phase control block 90G. The phase calibration circuit 72(1) is configured to generate a first phase calibration signal 128 which is received by the driver stage phase control block 90E and a second phase calibration signal 130 which is received by the final stage phase control block 90G. The driver stage phase control block 90E is configured to generate a control output C5 that sets a phase shift of the intermediate RF amplifier stage 36B while the final stage phase control block 90G is configured to generate a control output C6 that sets a phase shift of the final RF amplifier stage 36C. With the first phase calibration signal 128 and the second phase calibration signal 130, the phase calibration circuit 72(1) is configured to control the driver stage phase control block 90E and the final stage phase control block 90G and thereby regulate the phase shift of the RF amplification circuit 36. As explained in further detail below, the phase calibration circuit 72(1) controls the phase shift of the RF amplification circuit 36 in order to reduce the difference between the open-loop phase response and closed-loop phase response of the RF amplification circuit 36. In one exemplary embodiment, the driver stage phase control block 90E is an impedance control circuit and the control output C5 is a control word that sets a capacitance of a capacitor bank in the first interstage filter 78. Additionally, the final stage phase control block 90G is an impedance control circuit and the control output C6 is a control word that sets a capacitance of a capacitor bank in the second interstage filter 82.

With regard to the closed-loop phase linearization circuit 52(1), the closed-loop phase linearization circuit 52(1) is configured to adjust the phase shift of the RF amplification circuit 36 in accordance to the phase error signal 115 while activated so as to maintain the phase shift of the RF amplification circuit 36 relatively constant. In this embodiment, the closed-loop phase linearization circuit 52(1) is operably associated with the driver stage phase control block 90F and the final stage phase control block 90I. The closed-loop phase linearization circuit 52(1) is configured to generate a first phase control signal 132 which is received by the driver stage phase control block 90F and a second phase control signal 134 which is received by the final stage phase control block 90I. The driver stage phase control block 90F is configured to set the phase shift of the first interstage filter 78 and/or the intermediate RF amplifier stage 36B using the first phase control signal 132, while the final stage phase control block 90I is configured to set the phase shift of the second interstage filter 82 and/or the final RF amplifier stage 36C using the second phase control signal 134. In this manner, the closed-loop phase linearization circuit 52(1) is configured to control the phase shift of the RF amplification circuit 36(1). In one exemplary embodiment, the driver stage phase control block 90F is a varactor and the first phase control signal 132 is used to set a variable capacitance of the varactor. Additionally, the final stage phase control block 90I may also be a varactor and the second phase control signal 134 is used to set a variable capacitance of the varactor.

To avoid the use of bulky couplers for power detection, a first final stage replica amplifier 92 is configured to generate the first feedback signal 106. As mentioned above, the first feedback signal level of the first feedback signal 106 is indicative of the current level of the amplified RF signal 26. However, in this embodiment, the first feedback signal 106 is not generated as direct feedback resulting from the amplified RF signal 26. Instead, the first final stage replica amplifier 92 is configured to generate the first feedback signal 106 as an analog of the amplified RF signal 26. The first final stage replica amplifier 92 is a scaled-down version of the final RF amplifier stage 36C and is coupled to receive the second interstage RF signal 80 just like the final RF amplifier stage 36C. The first final stage replica amplifier 92 is configured to generate the first feedback signal 106 such that the first feedback signal level is a scaled down replication of the current level of the amplified RF signal 26. Since the first feedback signal 106 is not filtered by the output matching filter 84, the first harmonic filter 96 is configured to filter high-frequency harmonics from the first feedback signal 106 and increase the performance of the gain error detection circuit 88. Furthermore, it should be noted that the TRP VSWR circuit 86 is coupled to receive the second feedback signal 108 before the amplified RF signal 26 is filtered by the output matching filter 84. This avoids a propagation delay of the output matching filter 84, which can be detrimental to the operations of the TRP VSWR circuit 86.

The second final stage replica amplifier 94 shown in FIG. 4 is configured to generate the third feedback signal 124. As mentioned above, the third feedback signal level of the third feedback signal 124 is indicative of the phase of the amplified RF signal 26. In this way, the static or slowly varying phase coming from the load impedance $Z_L$ (shown in FIG. 1) is rejected and only the dynamic phase variation is passed to the closed-loop phase linearization circuit 52(1). However, the third feedback signal 124 is not generated as direct feedback resulting from the amplified RF signal 26. Instead, the second final stage replica amplifier 94 is configured to generate the third feedback signal 124 as an analog of the amplified RF signal 26. The second final stage replica amplifier 94 is a scaled-down version of the final RF amplifier stage 36C and is coupled to receive the second interstage RF signal 80 just like the final RF amplifier stage 36C. The second final stage replica amplifier 94 is configured to generate the third feedback signal 124 such that a phase of the third feedback signal 124 matches the phase of the amplified RF signal 26. Since the third feedback signal 124 is not filtered by the output matching filter 84, the second harmonic filter 98 is configured to filter high-frequency harmonics from the third feedback signal 124 and increase the performance of the phase error detection circuit 100.

With regard to reference paths, the third harmonic filter 102 is configured to filter signal components (e.g., noise, harmonics) from the first reference signal 110 and increase the performance of the gain error detection circuit 88. In this manner, the input matching filter 74 can provide impedance matching with the source impedance $Z_s$ (shown in FIG. 1) while the third harmonic filter 102 removes unwanted signal components from the first reference signal 110. Similarly, the fourth harmonic filter 104 is configured to filter signal components (e.g., noise, harmonics) from the second reference signal 126 and increase the performance of the gain error detection circuit 88. In this manner, the input matching filter 74 can provide impedance matching with the source impedance $Z_s$ (shown in FIG. 1) while the fourth harmonic filter 104 removes unwanted signal components from the second reference signal 126.

With regard to the closed-loop gain linearization circuit 50(1) of the amplifier control circuit 38(2), the gain error detection circuit 88 is a part of the closed-loop gain linearization circuit 50(1) (and, in this embodiment, also the gain calibration circuit 70(1)). The gain error detection circuit 88 (and thus the closed-loop gain linearization circuit 50(1)) is configured to endogenously establish the target gain magnitude using the RF signal 24. More specifically, the gain error detection circuit 88 is configured to receive the first reference signal 110 having a reference signal level that indicates a signal level of the RF signal 24. The gain error detection circuit 88 is configured to detect a signal amplitude of the RF signal 24 from the first reference signal 110. For instance, the gain error detection circuit 88 may detect an envelope of the first reference signal 110, which thereby indicates an envelope (i.e., the signal amplitude) of the RF signal 24. The gain error detection circuit 88 is configured to endogenously establish a target reference amplitude that is set in accordance with the target gain magnitude. For example, internal characteristics of the gain error detection circuit 88 may be provided in accordance with the target gain magnitude. In this manner, the envelope of the first reference signal 110 is scaled by the target gain magnitude to indicate the target reference amplitude for the amplified RF signal 26.

The gain error detection circuit 88 is also configured to detect a measured signal amplitude of the amplified RF signal 26. In this embodiment, the gain error detection circuit 88 is configured to receive the first feedback signal 106 having a feedback signal level that indicates a signal level (e.g., the current level) of the amplified RF signal 26. The gain error detection circuit 88 may detect an envelope of the first feedback signal 106. Once the TRP VSWR circuit 86 has set the feedback gain in accordance with the VSWR measurement, the envelope of first feedback signal 106 is scaled by the feedback gain and thereby detects the measured signal amplitude of the amplified RF signal 26. The gain error detection circuit 88 then compares the envelope of the target reference amplitude with the measured signal amplitude. The gain error detection circuit 88 generates the gain error signal 114 having an error signal level that indicates a difference between the target reference amplitude and the measured signal amplitude.

To provide linearization of the gain of the RF amplification circuit 36(1), the closed-loop gain linearization circuit 50(1) is configured to adjust the gain magnitude of the gain of the RF amplification circuit 36(1) so as to reduce the difference between the target reference amplitude and the measured signal amplitude of the amplified RF signal 26. More specifically, the closed-loop gain linearization circuit 50(1) is configured is configured to adjust the gain magnitude of the gain of the RF amplification circuit 36(1) in accordance with the error signal level of the gain error signal 114 in order to maintain the gain magnitude at the target gain magnitude. The target gain magnitude is approximately constant, and thus the closed-loop gain linearization circuit 50(1) linearizes the gain of the RF amplification circuit 36(1) while active.

The closed-loop gain linearization circuit 50(1) may be configured to control the gains of more than one of the RF amplifier stages 36A, 36B, 36C in order to linearize the gain of the RF amplification circuit 36(1). In this embodiment, the closed-loop gain linearization circuit 50(1) is configured to control the gain of the intermediate RF amplifier stage 36B and the gain of the final RF amplifier stage 36C to linearize the gain of the RF amplification circuit 36(1). More specifically, the closed-loop gain linearization circuit 50(1) is operably associated with the driver stage gain control block 90B and the final stage gain control block 90D in order to control the gain of the RF amplification circuit 36(1). In this specific embodiment, the closed-loop gain linearization circuit 50(1) is configured to control the intermediate RF amplifier stage 36B and the final RF amplifier stage 36C in order to linearize the gain of the RF amplification circuit 36(1). However, alternative embodiments of the closed-loop gain linearization circuit 50(1) may control any subset of the RF amplifier stages 36A, 36B, 36C in order to linearize the gain of the RF amplification circuit 36(1). As such, to set the gain of the RF amplification circuit 36(1) to the target gain magnitude established by the set point, the closed-loop gain linearization circuit 50(1) may be configured to linearize the gain of the RF amplification circuit 36(1) by controlling more than one of the RF amplifier stages 36A, 36B, 36C.

The closed-loop gain linearization circuit 50(1) is configured to generate the first gain control signal 120 and the second gain control signal 122, as explained above. The first gain control signal 120 is received by the driver stage gain control block 90B and the second gain control signal 122 is received by the final stage gain control block 90D. The driver stage gain control block 90B is configured to generate the control signal C3 that sets the gain of the intermediate RF amplifier stage 36B, while the final stage gain control block 90D is configured to generate the control signal C4 that sets the gain of the final RF amplifier stage 36C. To reduce the difference between the target signal amplitude and the measured signal amplitude, the closed-loop gain linearization circuit 50(1) is configured to adjust the gain magnitude of the gain of the driver stage gain control block 90B with the control signal C3 and adjust the gain magnitude of the gain of the final stage gain control block 90D based on the error signal level of the gain error signal 114 to control the gain of the RF amplification circuit 36(1). Accordingly, the closed-loop gain linearization circuit 50(1) linearizes the gain of the RF amplification circuit 36(1) and maintains the closed-loop gain response of the RF amplification circuit 36(1) substantially constant. In this embodiment, the closed-loop gain linearization circuit 50(1) adjusts the gain of the intermediate RF amplifier stage 36B while the amplified RF signal 26 is below a threshold power level. In contrast, the closed-loop gain linearization circuit 50(1) adjusts the gain of the final RF amplifier stage 36C while the amplified RF signal 26 is above a threshold power level. For example, the RF amplification circuit 36(1) may be a non-saturated amplification circuit. The threshold power level is generally near saturation and allows the closed-loop gain linearization circuit 50(1) to extend the closed-loop gain response into higher power levels.

As mentioned above, the driver stage gain control block 90B is the impedance control block and the control signal C3 is an impedance control signal that sets the impedance level of the intermediate RF amplifier stage 36B to adjust the gain magnitude of the gain of the intermediate RF amplifier stage 36B. In alternative embodiments, the driver stage gain control block 90B may be any type of control block suitable to control any operational characteristic (e.g., bias signal level of a bias signal) of the intermediate RF amplifier stage 36B to adjust the gain magnitude of the gain of the intermediate RF amplifier stage 36B. In this embodiment, by adjusting the control signal level of the first gain control signal 120, the closed-loop gain linearization circuit 50(1) is configured to adjust the control signal level of the control signal C3 and therefore adjust the impedance level of the intermediate RF amplifier stage 36B. In this manner, the gain magnitude of the gain of the intermediate RF amplifier stage 36B is adjusted based on the error signal level of the gain error signal 114 so as to linearize the gain of the RF amplification circuit 36(1) while the amplified RF signal 26 is below the threshold power level.

With regard to the second gain control signal 122, the closed-loop gain linearization circuit 50(1) also sets a control signal level of the second gain control signal 122 based on the error signal level of the gain error signal 114. The final stage gain control block 90D is configured to receive the second gain control signal 122 and adjust a control signal level of the control signal C4 based on the control signal level of the second gain control signal 122. As mentioned above, the final stage gain control block 90C is the final stage biasing circuit and the control signal C4 is the bias signal having a bias signal level that sets the quiescent operating level of the final RF amplifier stage 36C. In alternative embodiments, the final stage gain control block 90D may be any type of control block suitable to control any operational characteristic (e.g., impedance level) of the final RF amplifier stage 36C to adjust the gain magnitude of the gain of the final RF amplifier stage 36C. Accordingly, by adjusting the control signal level of the second gain control signal 122, the closed-loop gain linearization circuit 50(1) is configured to adjust a bias signal level of the control signal C4 and therefore adjust the quiescent operating level of the final RF amplifier stage 36C. In this manner, the gain magnitude of the gain of the final RF amplifier stage 36C is adjusted based on the error signal level of the gain error signal 114 so as to linearize the gain of the RF amplification circuit 36(1) while the amplified RF signal 26 is above the threshold power level.

In one embodiment, the RF signal 24 and the amplified RF signal 26 are each a modulated RF signal having a modulated signal amplitude. Therefore, the signal envelopes of the RF signal 24 and the amplified RF signal 26 are modulated signal envelopes. As such, the target signal amplitude may be a modulated target signal amplitude provided by a target signal envelope.

Figure 5:
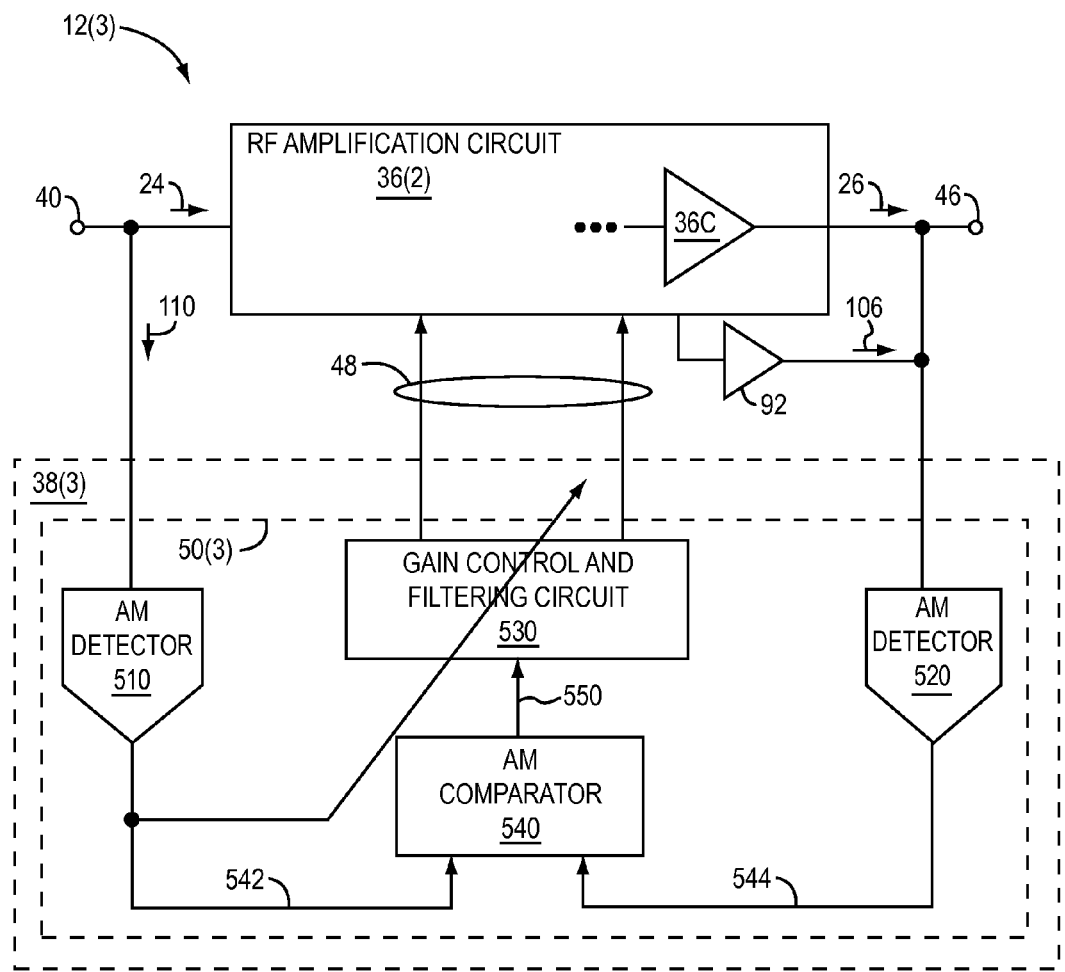
FIG. 5 illustrates still another embodiment of an RF amplification device, where a loop gain of an amplifier control circuit is adjusted by adjusting a gain of a gain control and filtering circuit.

FIG. 5 illustrates another embodiment of an RF amplification device 12(3) that includes another embodiment of an RF amplification circuit 36(2) and an amplifier control circuit 38(3). The amplifier control circuit 38(3) includes one embodiment of a closed-loop gain linearization circuit 50(3). The RF amplification circuit 36(3) is configured to amplify the RF signal 24 so as to generate the amplified RF signal 26. The closed-loop gain linearization circuit 50(3) includes one embodiment of an amplitude modulation (AM) detector 510, an AM detector 520, a gain control and filtering circuit 530, and an AM comparator 540. The AM detector 510 is configured to receive the first reference signal 110 and generate a reference envelope signal 542 based on the first reference signal 110. The AM detector 520 is configured to receive the first feedback signal 106 from the first final stage replica amplifier 92 and generate a feedback envelope signal 544 based on the first feedback signal 106. The comparator 540 is configured to receive the reference envelope signal 542 and the feedback envelope signal 544 and generate an error signal 550. The gain control and filtering circuit 530 is configured to generate the control output 48 based on the error signal 550 so as to linearize a gain of the RF amplification circuit 36(2).

The closed-loop gain linearization circuit 50(3) is configured to provide gain linearization. The gain linearization provided by the closed-loop gain linearization circuit 50(3) depends on a loop magnitude of the loop gain provided by the closed-loop gain linearization circuit 50(3). At low signal levels of the RF signal 24 and the amplified RF signal 26, an AM detector gain of the AM detector 510 and an AM detector gain of the AM detector 520 usually collapse to very small values, which makes the loop gain drop below unity and thus makes the closed-loop gain linearization circuit 50(3) inactive. However, at very low signal levels, a gain response of the RF amplification circuit 36(2) may be linear and therefore no linearization is needed for the gain response.

However, at some threshold power level of the RF signal 24, the gain response may not be linear and the gain response may experience distortion if correction is not provided. To extend the power range at which the gain response is linear, the closed-loop gain linearization circuit 50(3) should provide corrections so that the gain response remains linear when the RF signal 24 is above the threshold power level.

For example, the RF amplification circuit 36(2) may tend to have a very low quiescent current near the threshold power level when distortion starts occurring in the gain response. This can result in the threshold power level being below and often outside the dynamic range of other closed-loop control circuits in related art.

The closed-loop gain linearization circuit 50(3) shown in FIG. 5 eliminates the distortion at low to moderate power levels, which extends the dynamic range of the closed-loop gain linearization circuit 50(3). The signal level of the reference envelope signal 542 generated by the AM detector 510 indicates a reference RF signal envelope of the RF signal 24. The RF signal 24 may be modulated, and thus the signal amplitude of the RF signal 24 is modulated. In this embodiment, the signal level of the reference envelope signal 542 is used to control the loop gain of closed-loop gain linearization circuit 50(3) by adjusting a gain of the gain control and filtering circuit 530 based the signal level of the reference envelope signal 542.

Figure 6B:
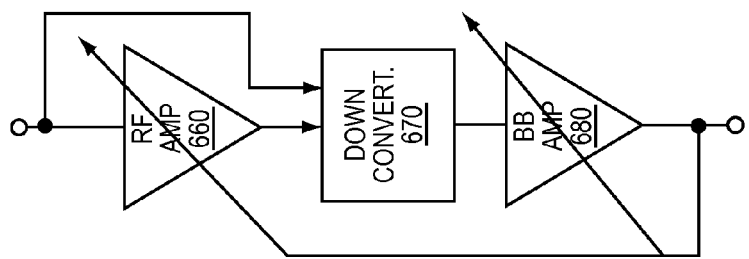
FIG. 6B illustrates a generalized circuit diagram for describing techniques for adjusting a loop gain.
Figure 6A:
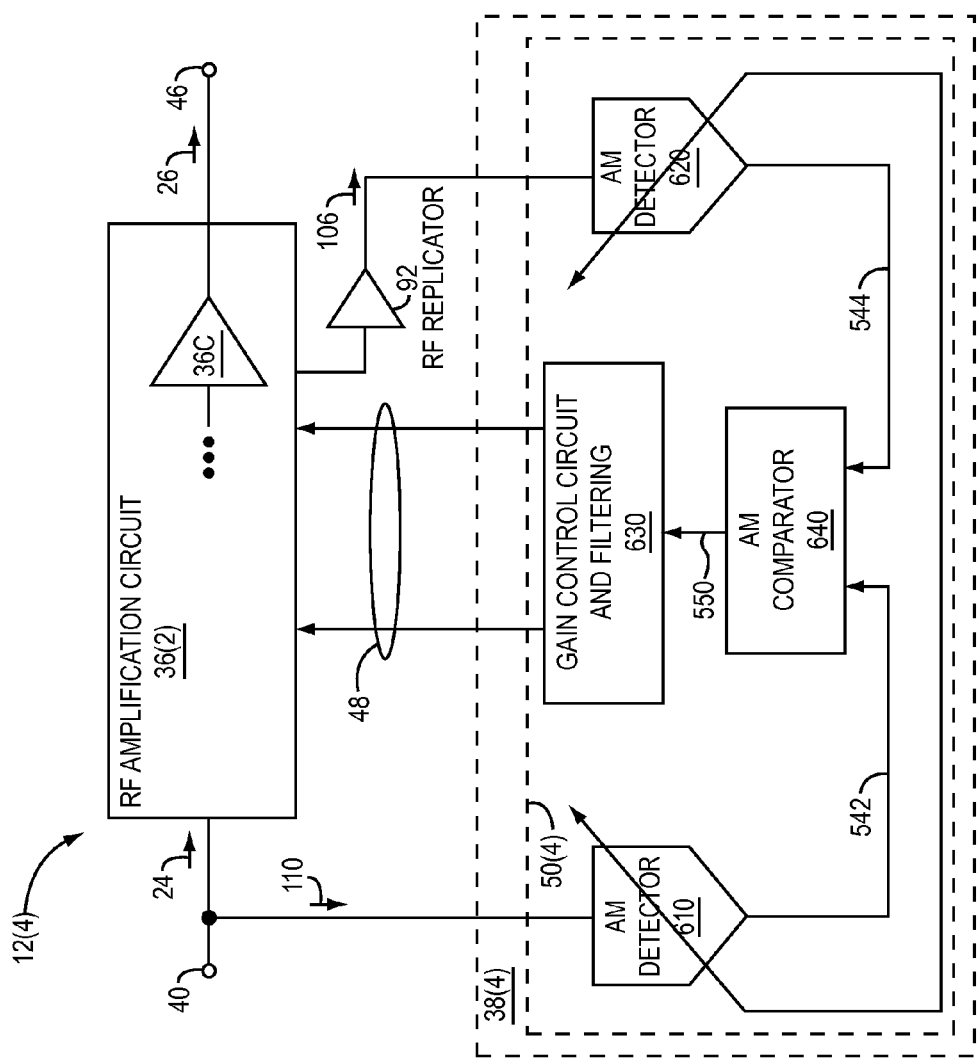
FIG. 6A illustrates yet another embodiment of an RF amplification device, where a loop gain of an amplifier control circuit is adjusted by adjusting AM detector gains of a gain control and filtering circuit.

FIG. 6A illustrates another embodiment of an RF amplification device 12(4) that includes the RF amplification circuit 36(2) and an embodiment of an amplifier control circuit 38(4). The amplifier control circuit 38(4) includes one embodiment of a closed-loop gain linearization circuit 50(4). The closed-loop gain linearization circuit 50(4) includes one embodiment of an AM detector 610, an AM detector 620, a gain control and filtering circuit 630, and an AM comparator 640. The AM detector 610, the AM detector 620, the gain control and filtering circuit 630, and the AM comparator 640 are similar to the AM detector 510, the AM detector 520, the gain control and filtering circuit 530, and the AM comparator 540, respectively. However, in this embodiment, a loop gain of the closed-loop gain linearization circuit 50(4) is adjusted by adjusting an AM detector gain of the AM detector 610 based on the reference envelope signal 542, and an AM detector gain of the AM comparator 640 is adjusted based on the feedback envelope signal 544. The AM detector 510 is configured to receive the first reference signal 110 and generate the reference envelope signal 542 based on the first reference signal 110. The AM detector 520 is configured to receive the first feedback signal 106 from the first final stage replica amplifier 92 and generate the feedback envelope signal 544 based on the first feedback signal 106. A signal level of the feedback envelope signal 544 generated by the AM comparator 640 indicates a feedback RF signal envelope of the amplified RF signal 26. The comparator 540 is configured to receive the reference envelope signal 542 and the feedback envelope signal 544 and generate an error signal 550. The gain control and filtering circuit 530 is configured to generate the control output 48 based on the error signal 550 so as to linearize a gain of the RF amplification circuit 36(2).

Thus, the loop gain of the closed-loop gain linearization circuit 50(4) can be also boosted by controlling the AM detector gains of the AM detector 610, as shown in FIG. 6A. One possibility is to leave each of the AM detectors 610, 620 controlled by the envelope signal 542, 544 at its own output. Such a choice is particularly suboptimal for moderate to large signal levels, where distortion may appear and the reference and feedback envelope signals 542, 544 may become unequal. Having different AM detector gains for the AM detectors 610, 620 may result in mismatches that can result in the distortion of the AM detectors 610, 620 at the output of the RF amplification circuit 36(2).

In another embodiment, one of the envelope signals 542, 544 is used to control the AM detector gains of both AM detectors 610 and 620 such that their AM detector gains are maintained substantially matched. Thus, the AM detector distortion is repeated as a common mode signal in the AM comparator 640 that subtracts the envelope signals 542, 544.

Since the first reference signal 110 has the lowest power levels, controlling both the AM detector gains of AM detectors 610, 620 with the feedback envelope signal 544 may be the preferred implementation. In some cases, driver stages (e.g., the initial RF amplifier stage 36A and the intermediate RF amplifier stage 36B shown in FIG. 4) of the RF amplification circuit 36(2) operate linearly, and a reference signal used to perform the closed-loop gain linearization can be tapped from an output of one these driver stages to an input of the RF amplification circuit 36(2). The main advantage of this design is having larger signals at the input of the AM detector 610 and thus having higher gain magnitude to provide more effective distortion correction.

FIG. 6B is a generalized circuit diagram illustrating that there are multiple ways in which AM detectors can be controlled. First, the AM detector gain may be controlled with an RF variable gain amplifier 660 placed in front of down-conversion circuit 670. Second, the AM detector gain can be controlled with a baseband variable gain amplifier 680 placed after the down-conversion circuit 670. Finally, the AM detector gain can be controlled using both the RF variable gain amplifier 660 and the baseband variable gain amplifier 680. Such gain boosting of the AM detector gain constitutes a local feedback loop which can be maintained stable at all signal levels.

Although it is possible for the closed-loop gain linearization circuit 50(4) to control a single gain control block 90, this is generally suboptimal since the gain control range of a given gain control block 90 may be limited. To increase the effectiveness of the closed-loop gain linearization circuit 50(4), the gain control range of the closed-loop gain linearization circuit 50(4) needs to be larger than the maximum gain distortion variation of the RF amplification circuit 36(2) when the RF amplification circuit 36(2) is operating in open-loop. If more than 10 db-15 dB of gain magnitude variation is present in a main RF amplification path defined by the RF amplification circuit 36(2), correcting it with a single gain central point may be difficult. Thus, the closed-loop gain linearization circuit 50(4) may control multiple control blocks as described above with respect to the closed-loop gain linearization circuit 50(1) shown in FIG. 4.

Figure 7:
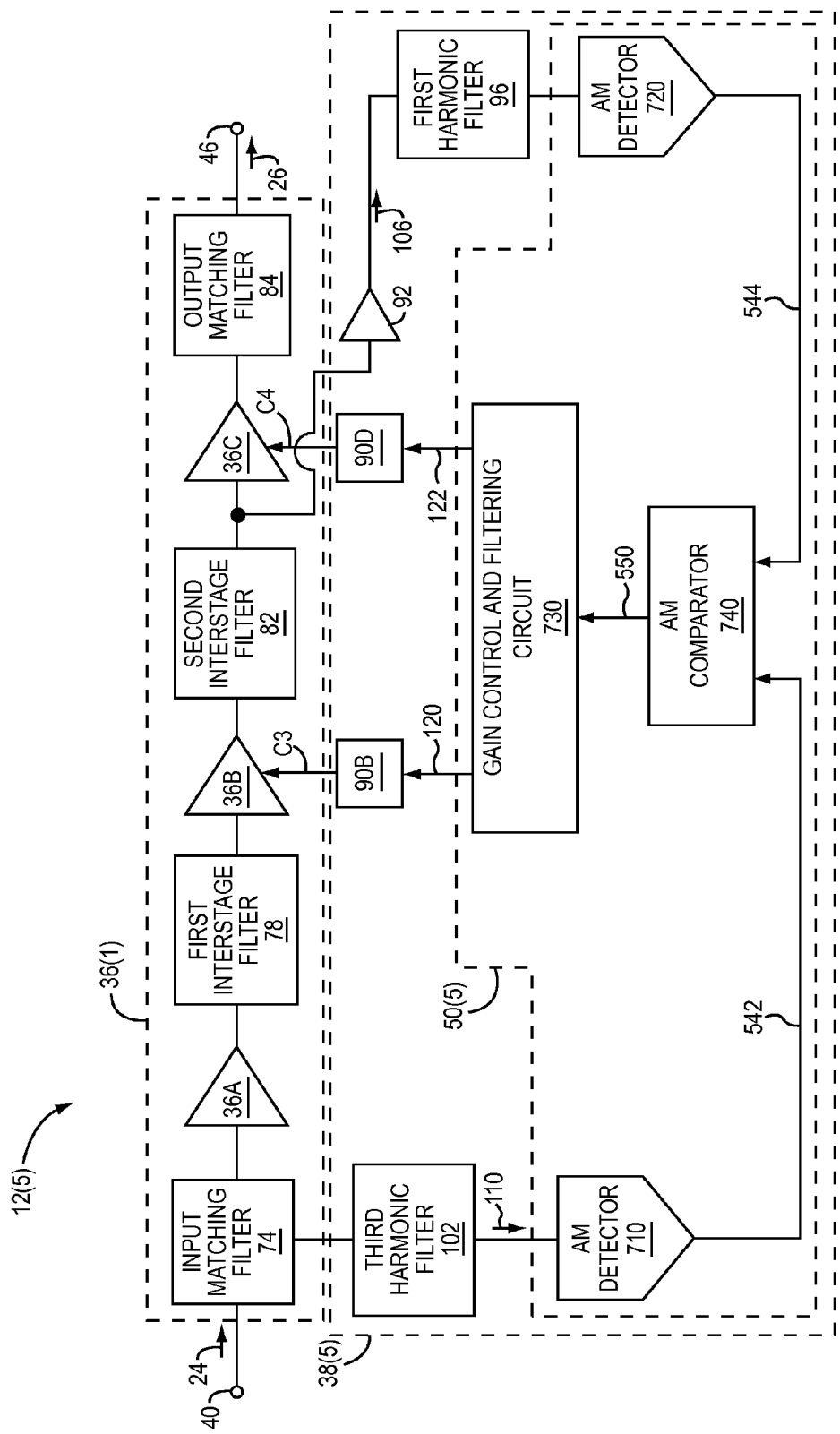
FIG. 7 illustrates still another embodiment of an RF amplification device, where a loop gain of an amplifier control circuit is adjusted through gain control blocks.

FIG. 7 illustrates another embodiment of an RF amplification device 12(5) that includes the RF amplification circuit 36(1) and an embodiment of an amplifier control circuit 38(5). The amplifier control circuit 38(5) includes one embodiment of a closed-loop gain linearization circuit 50(5). The closed-loop gain linearization circuit 50(5) includes one embodiment of an AM detector 710, an AM detector 720, a gain control and filtering circuit 730, and an AM comparator 740. The amplifier control circuit 38(5), further includes the gain control blocks 90B, 90D, the first harmonic filter 96, and the third harmonic filter 102, described above with respect to FIG. 4. The AM detector 710, the AM detector 720, the gain control and filtering circuit 730, and the AM comparator 740 operate in a similar manner to the AM detector 510, the AM detector 520, the gain control and filtering circuit 530, and the AM comparator 540, respectively.

In this embodiment, the gain control and filtering circuit 730 controls the gain of intermediate RF amplifier stage 36B by generating the first gain control signal 120, and controls the gain of the final RF amplifier stage 36C by generating the second gain control signal 122. Thus, two gain control points are used. In other more general schemes, more than two gain control points can be used. It may be preferable not to control the gain of the initial RF amplifier stage 36A in order to minimize distortion reflection at an input of the RF amplification circuit 36(1) (input VSWR variation).

The noise contribution of the closed-loop gain linearization circuit 50(5) is often significant and sometimes dominant. For noise performance, the placement of the gain control point(s) on an RF signal path defined by the RF amplification circuit 36(1) may be important, since different positions have different noise up-conversion gains. The advantage of a multiple gain control points architecture, such as the one illustrated in FIG. 7, is that the noise performance can be optimized over the signal power level.

Many RF amplifiers exhibit noise peaking at moderate power levels. The noise up-conversion gain may depend on the structure of the relevant RF amplifier stage 36A-36C and the bias level provided. The final RF amplifier stage 36C often may provide a large noise up-conversion gain due to its highly nonlinear operation. In such cases, it is preferred that most of the gain linearization is performed by controlling the gain of the RF amplifier stage 36B, and at very high power levels control the gain of the final RF amplifier stage 36C. Control ranges of the RF amplifier stages 36B, 36C may overlap in order to keep the closed-loop gain linearization circuit 50(5) on all the time. Control of the intermediate RF amplifier stage 36B may stop at a certain power level or may continue along with the control of the final RF amplifier stage 36C up to the maximum operation power level. The gain control and filtering circuit 730 may determine the amount of gain control for each of the RF amplifier stages (e.g., 36B and 36C) at a given power level.

In general, performing most of the gain correction in the intermediate RF amplifier stage 36B also results in better system efficiency. First, it is easier and more power-efficient to control the gain of the intermediate RF amplifier stage 36B. Furthermore, controlling the gain of the RF amplifier stages 36A, 36B preceding the final RF amplifier stage 36C results in signal power levels at an input of the final RF amplifier stage 36C, and thus higher efficiency at the final RF amplifier stage 36C. In one embodiment, the gain of the final RF amplifier stage 36C expands (grows) with signal power at moderate power levels, and the gain of the intermediate RF amplifier stage 36B is made to decrease by the gain control and filtering circuit 730 in order to compensate for such expansion and keep the overall gain of the RF amplification circuit 36(1) constant. At higher power levels, the gains of the RF amplifier stages 36A-36C are compressed. In particular, the gain of the final RF amplifier stage 36C compresses with higher power levels due to finite available headroom, device saturation, and clipping effects. Such gain compression can be compensated for by having the gain control and filtering circuit 730 determine a gain increase in the intermediate RF amplifier stage 36B and/or the final RF amplifier stage 36C.

When one of the RF amplifier stages 36A-36C in the forward RF signal path or the reference and feedback signal paths defined by the first harmonic filter 96, the third harmonic filter 102, the AM detector 710, the AM detector 720, the gain control and filtering circuit 730, the AM comparator 740, and the gain control blocks 90B, 90D clips, the gain of the component in the forward RF signal path, the reference signal path, and the feedback signal path goes to zero (0), and with it the loop gain goes to zero (0), making it operate more and more as if inactive. If the loop gain is still larger than unity, the closed-loop gain linearization circuit 50(5) still provides corrections.

For instance, the RF amplifier stages 36A-36C used in the RF power amplification circuit 36(1) may have a source/emitter terminal grounded from the signal perspective. This results in high gain, but also in very high up-conversion gain and thus degraded noise performance, particularly when closed-loop gain linearization is used. For efficiency reasons it is desired that the source/emitter terminal be grounded.

Figure 8:
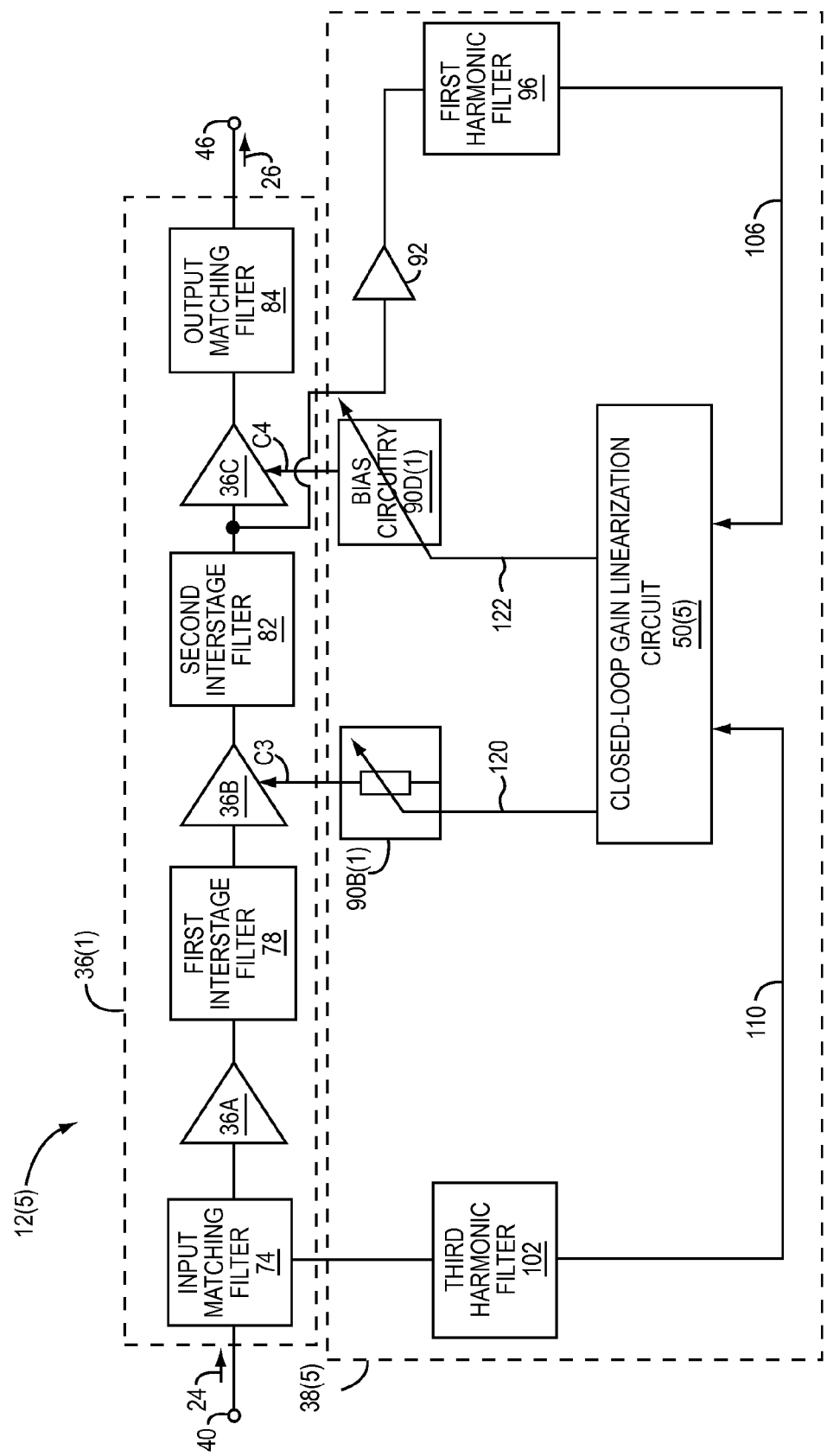
FIG. 8 illustrates an embodiment of the RF amplification device shown in FIG. 7, including one embodiment of one of the gain control blocks.

FIG. 8 illustrates one embodiment of the RF amplification device 12(5). The amplifier control circuit 38(5) shown in FIG. 8 includes one embodiment of an impedance control block 90B(1), which is one embodiment of the gain control block 90B shown in FIG. 7, and bias circuitry 90D(1), which is one embodiment of the gain control block 90D shown in FIG. 7. The impedance control block 90B(1) controls an impedance of the intermediate RF amplifier stage 36B, which is assumed to have a grounded source/emitter in this embodiment. In this embodiment, the impedance control block 90B(1) includes one or more controllable impedance components. Controlling the gain of the RF amplification circuit 36(1) can be done using the impedance control block 90B(1) and the bias circuitry 90D(1). By controlling the impedance of the intermediate RF amplifier stage 36B, distortion and noise performances are improved by significantly improving the linearity of the intermediate RF amplifier stage 36B. Related art discloses controlling impedances to realize attenuators in the RF signal path; however, these attenuation techniques do not offer distortion and noise performance improvement benefits.

Figure 8A:
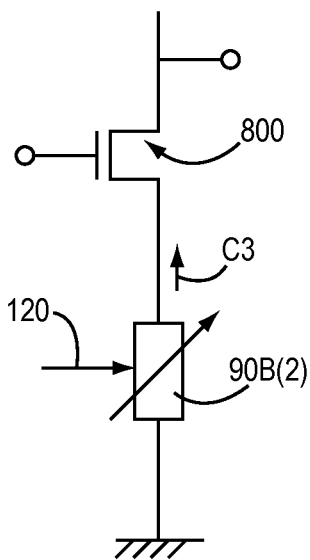
FIG. 8A illustrates another embodiment of one of the gain control blocks shown in FIG. 7.

FIG. 8A illustrates another embodiment of an impedance control block 90B(2), which is another embodiment of the control block 90B shown in FIG. 7, and an embodiment of an RF amplifier stage 800, which is one embodiment of the intermediate RF amplifier stage 36B shown in FIG. 8. In this embodiment, a controllable impedance component is placed in a shunt feedback network of the RF amplifier stage 800, which increases the linearity of the RF amplifier stage 800. This can provide similar benefits with regard to overall gain linearity and noise up-conversion gain, as described above with respect to FIG. 8.

Figure 8B:
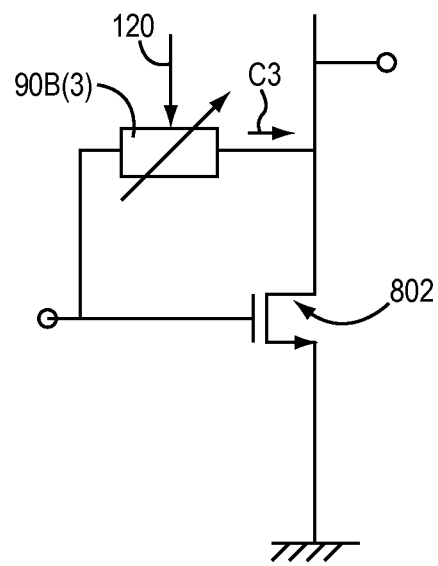
FIG. 8B illustrates still another embodiment of one of the gain control blocks shown in FIG. 7.

FIG. 8B illustrates another embodiment of an impedance control block 90B(3), which is another embodiment of the control block 90B shown in FIG. 7, and an embodiment of an RF amplifier stage 802, which is one embodiment of the intermediate RF amplifier stage 36B shown in FIG. 8. In this embodiment, a controlled impedance component is used in a feedback path of the RF amplifier stage 802. This increases the linearity of the RF amplifier stage 802. This can provide similar benefits with regard to overall gain linearity and noise up-conversion gain, as described above with respect to FIG. 8. It should be noted that a controlled impedance in a feedback path can be provided with one or more of the RF amplifier stages 36A-36C in the RF amplification circuit 36(1) shown in FIG. 8.

Referring now to FIGS. 8A and 8B, a maximum stage gain is determined by an intrinsic gain of the RF amplifier stages 800, 802, the minimum series impedance level (close to zero (0)) of the impedance control block 90B(2), and the maximum shunt impedance level (close to infinity) of the impedance control block 90B(3). Since it is easier to get longer shunt-controlled impedances than small controlled impedances, the impedance control block 90B(3) may be able to create a larger maximum gain for the intermediate RF amplifier stage 36B shown in FIG. 8. Appropriate filtering may also be needed for the first gain control signal 120.

Figure 9:
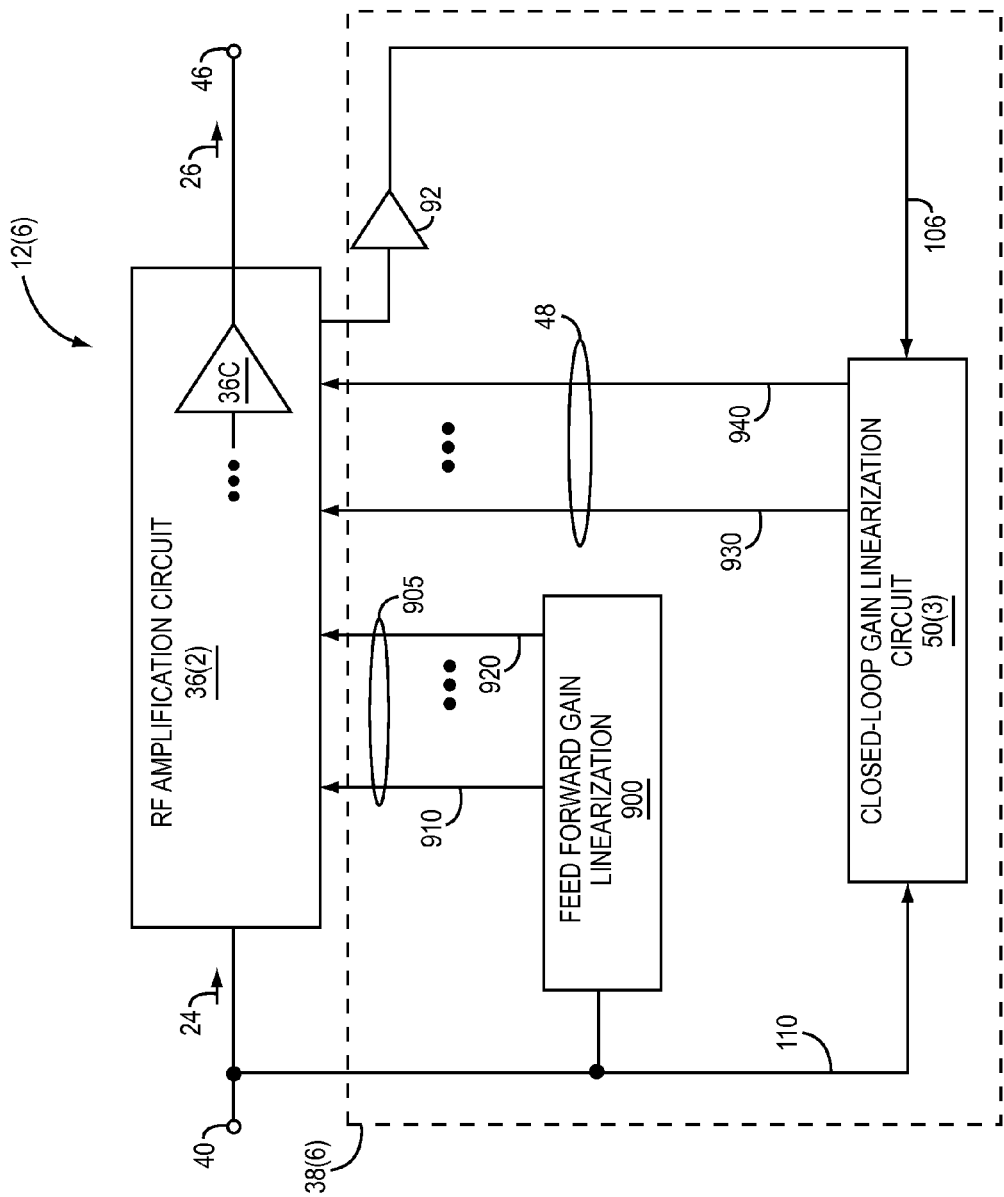
FIG. 9 illustrates another embodiment of an RF amplification device, where an amplifier control circuit includes a feed forward gain linearization circuit.

FIG. 9 illustrates another embodiment of an RF amplification device 12(6), the RF amplification circuit 36(2), and an amplifier control circuit 38(6). The amplifier control circuit 38(6) includes the closed-loop gain linearization circuit 50(3) described above with respect to FIG. 5. The amplifier control circuit 38(6) also includes a feed forward linearization circuit 900 configured to receive the first reference signal 110 and generate a control output 905 based on the first reference signal 110. The main advantage of this feed forward linearization circuit 900 is that it does not have the stability issues of the closed-loop gain linearization circuit 50(3) and therefore can have a large bandwidth even when driving large stages with high value capacitances. The control output 905 may have one or multiple gain control signals, such as a gain control signal 910 and a gain control signal 920, controlling one or multiple points in the RF amplification circuit 36(1). The feed forward linearization circuit 900 is blind, since it does not have any notion of the gain error (distortion). Therefore, if not sized properly and/or provided with appropriate design corners (gross temperature supply, etc.), the feed forward linearization circuit 900 may overshoot and thus overcompensate. Since the feed forward linearization circuit 900 is still the amplifier control circuit 38(6), any overcorrection or undercorrection by the feed forward linearization circuit 900 may be corrected by the closed-loop gain linearization circuit 50(3). As such, the feed forward gain linearization circuit 900 does not require calibration. In this embodiment, the control output 48 includes a gain control signal 930 and a gain control signal 940. As such, the feed forward linearization circuit 900 does not require calibration.

Figure 10:
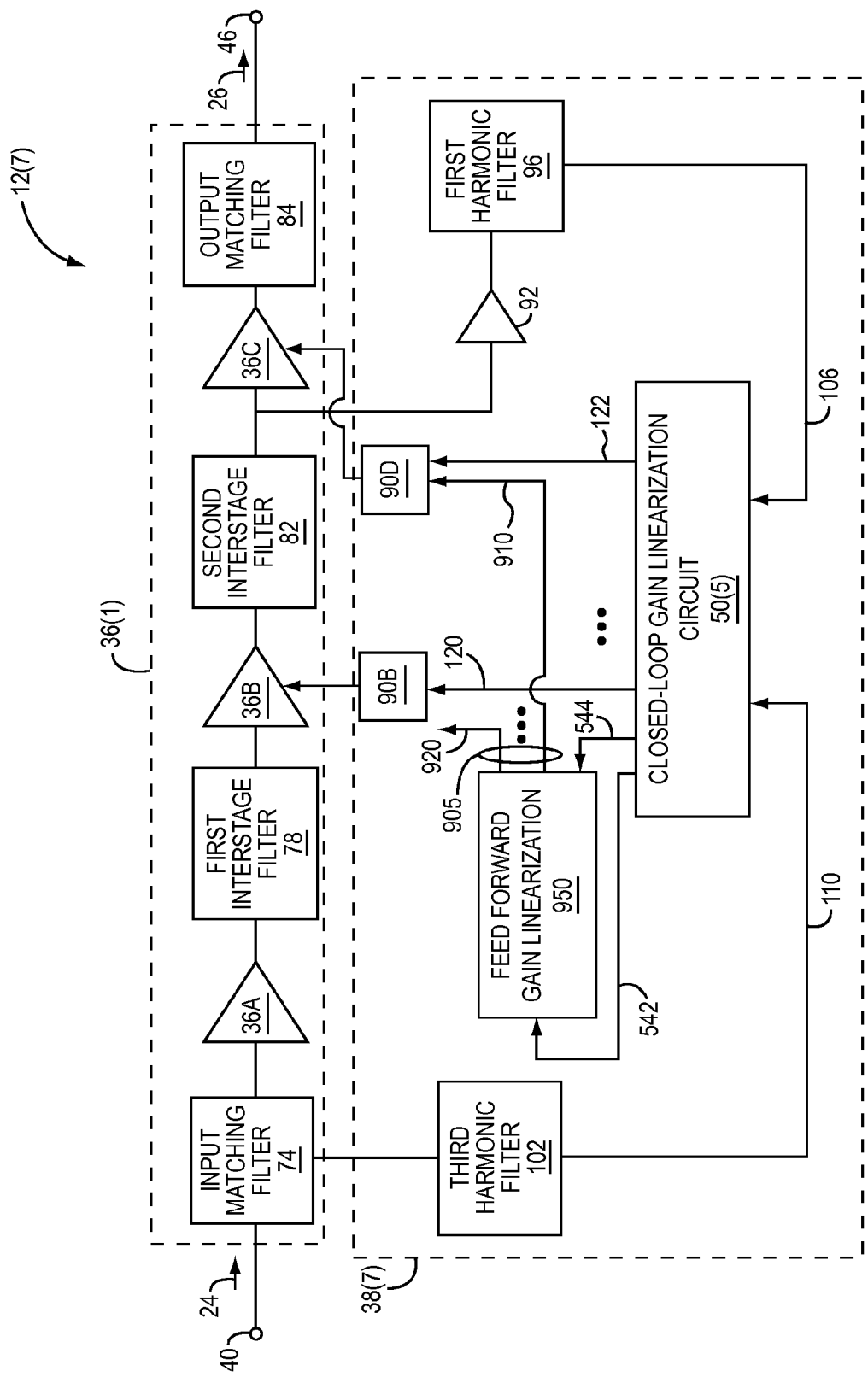
FIG. 10 illustrates another embodiment of an RF amplification device with another embodiment of a feed forward gain linearization circuit.

FIG. 10 illustrates another embodiment of an RF amplification device 12(7), the RF amplification circuit 36(1), and an amplifier control circuit 38(7). The amplifier control circuit 38(7) includes the closed-loop gain linearization circuit 50(5) described above with respect to FIG. 7. The amplifier control circuit 38(7) is the same as the amplifier control circuit 38(5) described above with regard to FIG. 7, except the amplifier control circuit 38(7) also includes a feed forward linearization circuit 950, which is configured to receive the reference envelope signal 542 and the feedback envelope signal 544 from the closed-loop gain linearization circuit 50(5) and generate the control output 905 based on the reference envelope signal 542 and the feedback envelope signal 544. In this embodiment, the control output 905 may have more than one control signal, such as the gain control signal 910 and the gain control signal 920. The gain control signal 910 controls the gain control block 90D. Additionally, the gain control signal 920 controls the intermediate RF amplifier stage 36B.

Those skilled in the art will recognize improvements and modifications to the embodiments of the present disclosure. All such improvements and modifications are considered within the scope of the concepts disclosed herein and the claims that follow.

What is claimed is:

1. Circuitry, comprising:
a radio frequency (RF) amplification circuit configured to amplify an RF signal in accordance with a gain of the RF amplification circuit so as to generate an amplified RF signal, wherein the RF amplification circuit comprises:
an initial RF amplifier stage configured to receive the RF signal from a package interface and amplify the RF signal in accordance with a first amplifier stage gain so as to generate a first interstage RF signal;
an intermediate RF amplifier stage configured to receive the first interstage RF signal from the initial RF amplifier stage and amplify the first interstage RF signal in accordance with a second amplifier stage gain so as to generate a second interstage RF signal; and
a final RF amplifier stage configured to receive the second interstage RF signal from the intermediate RF amplifier stage and amplify the second interstage RF signal in accordance with a third amplifier stage gain so as to generate the amplified RF signal, wherein the gain of the RF amplification circuit is an aggregate of the first amplifier stage gain, the second amplifier stage gain, and the third amplifier stage gain;
a closed-loop gain linearization circuit configured to:
endogenously establish a target gain magnitude using the RF signal; and linearize the gain of the RF amplification circuit in accordance with the target gain magnitude by being configured to adjust a first gain magnitude of the second amplifier stage gain to set a gain magnitude of the gain of the RF amplification circuit, by being configured further to adjust a second gain magnitude of the third amplifier stage gain to set the gain magnitude of the gain of the RF amplification circuit in accordance with the target gain magnitude, by being configured to adjust the first gain magnitude of the second amplifier stage gain, and by being configured to adjust an internal impedance level of the intermediate RF amplifier stage to set the gain magnitude of the gain of the RF amplification circuit in accordance with the target gain magnitude; and the package interface configured to receive the RF signal and transmit the amplified RF signal.

2. The circuitry of claim 1 wherein the closed-loop gain linearization circuit is configured to endogenously establish the target gain magnitude using the RF signal by being configured to:
  detect a first signal amplitude of the RF signal; and
  endogenously establish a target reference amplitude set in accordance with the target gain magnitude and the first signal amplitude of the RF signal.

3. The circuitry of claim 2 wherein the closed-loop gain linearization circuit is configured to linearize the gain by being configured to:
  detect a measured signal amplitude of the amplified RF signal; and
  adjust the gain magnitude of the gain of the RF amplification circuit so as to reduce a difference between the target reference amplitude and the measured signal amplitude of the amplified RF signal.

4. The circuitry of claim 1 wherein the RF amplification circuit comprises a plurality of RF amplifier stages connected in cascade, wherein the plurality of RF amplifier stages include the initial RF amplifier stage, the intermediate RF amplifier stage, and the final RF amplifier stage.

5. The circuitry of claim 4 wherein the RF amplification circuit is configured to control more than one of the RF amplifier stages in order to adjust the gain magnitude of the gain of the RF amplification circuit.

6. The circuitry of claim 4 wherein:
  the plurality of RF amplifier stages has a plurality of amplifier stage gains such that each RF amplifier stage of the plurality of RF amplifier stages has an amplifier stage gain of the plurality of amplifier stage gains, wherein the gain of the RF amplification circuit is an aggregate of the plurality of amplifier stage gains; and
  the closed-loop gain linearization circuit is configured to linearize the gain magnitude by being configured to adjust more than one of the plurality of amplifier stage gains.

7. The circuitry of claim 1 further comprising an amplifier control circuit that includes the closed-loop gain linearization circuit, wherein:
  the amplifier control circuit is configured to generate a control output that sets the gain of the RF amplification circuit; and
  the closed-loop gain linearization circuit is configured to linearize the gain of the RF amplification circuit in accordance with the target gain magnitude by being configured to adjust the control output in order to linearize the gain of the RF amplification circuit in accordance with the target gain magnitude.

8. The circuitry of claim 1 wherein the closed-loop gain linearization circuit is configured to adjust the second gain magnitude of the third amplifier stage gain by being configured to adjust a quiescent operating level of the final RF amplifier stage to set the gain magnitude of the gain of the RF amplification circuit in accordance with the target gain magnitude.

9. The circuitry of claim 1 wherein the closed-loop gain linearization circuit is configured to adjust the first gain magnitude of the second amplifier stage gain to set the gain magnitude of the gain of the RF amplification circuit in accordance with the target gain magnitude while the amplified RF signal is below a threshold power level, and is configured to adjust the second gain magnitude of the third amplifier stage gain to set the gain magnitude of the gain of the RF amplification circuit in accordance with the target gain magnitude while the amplified RF signal is above the threshold power level.

10. An integrated circuit (IC) package, comprising:
  a radio frequency (RF) amplification device integrated into the IC package, wherein the RF amplification device comprises:
  an RF amplification circuit configured to amplify an RF signal in accordance with a gain of the RF amplification circuit so as to generate an amplified RF signal, wherein the RF amplification circuit comprises:
    an initial RF amplifier stage configured to receive the RF signal from a package interface and amplify the RF signal in accordance with a first amplifier stage gain so as to generate a first interstage RF signal;
    an intermediate RF amplifier stage configured to receive the first interstage RF signal from the initial RF amplifier stage and amplify the first interstage RF signal in accordance with a second amplifier stage gain so as to generate a second interstage RF signal; and
    a final RF amplifier stage configured to receive the second interstage RF signal from the intermediate RF amplifier stage and amplify the second interstage RF signal in accordance with a third amplifier stage gain so as to generate the amplified RF signal, wherein the gain of the RF amplification circuit is an aggregate of the first amplifier stage gain, the second amplifier stage gain, and the third amplifier stage gain;
  a closed-loop gain linearization circuit configured to:
  endogenously establish a target gain magnitude using the RF signal; and
  linearize the gain of the RF amplification circuit in accordance with the target gain magnitude by being configured to adjust a first gain magnitude of the second amplifier stage gain to set a gain magnitude of the gain of the RF amplification circuit, by being configured further to adjust a second gain magnitude of the third amplifier stage gain to set the gain magnitude of the gain of the RF amplification circuit in accordance with the target gain magnitude, by being configured to adjust the first gain magnitude of the second amplifier stage gain, and by being configured to adjust an internal impedance level of the intermediate RF amplifier stage to set the gain magnitude of the gain of the RF amplification circuit in accordance with the target gain magnitude; and
  the package interface configured to receive the RF signal into the IC package and transmit the amplified RF signal from the IC package.

11. The IC package of claim 10 wherein the closed-loop gain linearization circuit is configured to endogenously establish the target gain magnitude using the RF signal by being configured to:
  detect a first signal amplitude of the RF signal; and
  endogenously establish a target reference amplitude set in accordance with the target gain magnitude and the first signal amplitude of the RF signal.

12. The IC package of claim 11 wherein the closed-loop gain linearization circuit is configured to linearize the gain magnitude by being configured to:
  detect a measured signal amplitude of the amplified RF signal; and
  adjust the gain magnitude of the gain of the RF amplification circuit so as to reduce a difference between the target reference amplitude and the measured signal amplitude of the amplified RF signal.

13. The IC package of claim 10 wherein the RF amplification circuit comprises a plurality of RF amplifier stages connected in cascade, wherein the plurality of RF amplifier stages include the initial RF amplifier stage, the intermediate RF amplifier stage, and the final RF amplifier stage.

14. The IC package of claim 13 wherein the RF amplification circuit is configured to control more than one of the RF amplifier stages in order to adjust the gain magnitude of the gain of the RF amplification circuit.

15. The IC package of claim 13 wherein:
  the plurality of RF amplifier stages has a plurality of amplifier stage gains such that each RF amplifier stage of the plurality of the RF amplifier stages has an amplifier stage gain of the plurality of amplifier stage gains, wherein the gain of the RF amplification circuit is an aggregate of the plurality of amplifier stage gains; and
  the closed-loop gain linearization circuit is configured to linearize the gain magnitude by being configured to adjust more than one of the plurality of amplifier stage gains.

16. The IC package of claim 15 wherein the plurality of RF amplifier stages comprises:
  the initial RF amplifier stage configured to receive the RF signal from the package interface and amplify the RF signal in accordance with the first amplifier stage gain so as to generate the first interstage RF signal;
  the intermediate RF amplifier stage configured to receive the first interstage RF signal from the initial RF amplifier stage and amplify the first interstage RF signal in accordance with the second amplifier stage gain so as to generate the second interstage RF signal; and
  the final RF amplifier stage configured to receive the second interstage RF signal from the intermediate RF amplifier stage and amplify the second interstage RF signal in accordance with the third amplifier stage gain so as to generate the amplified RF signal, wherein the gain of the RF amplification circuit is the aggregate of the first amplifier stage gain, the second amplifier stage gain, and the third amplifier stage gain, wherein the plurality of amplifier stage gains comprise the first amplifier stage gain, the second amplifier stage gain, and the third amplifier stage gain.

* * * * *